US010641875B2

(12) United States Patent
Liu et al.

(10) Patent No.: US 10,641,875 B2
(45) Date of Patent: May 5, 2020

(54) DELAY TIME CALIBRATION OF OPTICAL DISTANCE MEASUREMENT DEVICES, AND ASSOCIATED SYSTEMS AND METHODS

(71) Applicant: SZ DJI TECHNOLOGY CO., LTD., Shenzhen (CN)

(72) Inventors: Xiang Liu, Shenzhen (CN); Mingming Gao, Shenzhen (CN); Xiaoping Hong, Shenzhen (CN); Di Wu, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/944,561

(22) Filed: Apr. 3, 2018

(65) Prior Publication Data
US 2019/0064329 A1    Feb. 28, 2019

Related U.S. Application Data

(63) Continuation of application No. PCT/CN2017/100040, filed on Aug. 31, 2017.

(51) Int. Cl.
*G01C 3/08* (2006.01)
*G01S 7/4865* (2020.01)
(Continued)

(52) U.S. Cl.
CPC .......... *G01S 7/4865* (2013.01); *G01S 7/4861* (2013.01); *G01S 7/497* (2013.01); *G01S 17/10* (2013.01);
(Continued)

(58) Field of Classification Search
CPC ...... G01S 7/4865; G01S 17/10; G01S 17/933; G04F 10/005; H03K 3/037; H03K 5/01; H03K 2005/00078; B64C 39/024
See application file for complete search history.

(56) References Cited

U.S. PATENT DOCUMENTS

| 4,283,116 A | 8/1981 | Weis |
| 5,179,565 A | 1/1993 | Tsuchiya et al. |

(Continued)

FOREIGN PATENT DOCUMENTS

| CN | 101216562 A | 7/2008 |
| CN | 101256232   | 9/2008 |

(Continued)

OTHER PUBLICATIONS

Aijazi et al., "Segmentation Based Classification of 3D Urban Point Clouds: A Super-Voxel Based Approach with Evaluation," (2013), 27 pages.

(Continued)

*Primary Examiner* — Samantha K Abraham
(74) *Attorney, Agent, or Firm* — Finnegan, Henderson, Farabow, Garrett & Dunner, LLP

(57) ABSTRACT

Representative embodiments of the present technology include a device for measuring distance to an object. The device comprises a light emitter configured to emit an outbound light pulse and a light sensor configured to receive a returning light pulse and output a pulse signal representing the returning light pulse. The device further comprises a field-programmable gate array (FPGA) coupled to the light sensor and including a time-to-digital converter (TDC) having a series of sequentially coupled delay units. Individual sequentially coupled delay units are associated with corresponding individual delay times. At least some of the sequentially coupled delay units have different individual delay times. The TDC is configured to measure timing information of the pulse signal based at least in part on the individual delay times of the sequentially coupled delay units. The device further includes a controller configured to calculate the distance to the object based on the timing information.

19 Claims, 15 Drawing Sheets

(51) Int. Cl.

| | | |
|---|---|---|
| G04F 10/00 | (2006.01) | |
| H03K 3/037 | (2006.01) | |
| G01S 17/10 | (2020.01) | |
| G01S 17/933 | (2020.01) | |
| H03K 5/01 | (2006.01) | |
| G01S 7/4861 | (2020.01) | |
| G01S 17/93 | (2020.01) | |
| G01S 7/497 | (2006.01) | |
| B64C 39/02 | (2006.01) | |
| H03K 5/00 | (2006.01) | |

(52) U.S. Cl.
 CPC .......... *G01S 17/105* (2013.01); *G01S 17/933* (2013.01); *G01S 17/936* (2013.01); *G04F 10/005* (2013.01); *H03K 3/037* (2013.01); *H03K 5/01* (2013.01); *B64C 39/024* (2013.01); *H03K 2005/00078* (2013.01)

(56) References Cited

U.S. PATENT DOCUMENTS

| | | |
|---|---|---|
| 5,249,046 A | 9/1993 | Ulich et al. |
| 6,101,455 A | 8/2000 | Davis |
| 6,246,258 B1 | 6/2001 | Lesea |
| 6,344,937 B1 | 2/2002 | Sparrold et al. |
| 6,666,855 B2 | 12/2003 | Somani et al. |
| 7,085,400 B1 | 8/2006 | Holsing et al. |
| 7,236,299 B1 | 6/2007 | Smith et al. |
| 7,336,407 B1 | 2/2008 | Adams et al. |
| 7,564,571 B2 | 7/2009 | Karabassi et al. |
| 7,843,448 B2 | 11/2010 | Wheeler et al. |
| 7,899,598 B2 | 3/2011 | Woon et al. |
| 8,224,097 B2 | 7/2012 | Matei et al. |
| 8,396,293 B1 | 3/2013 | Korah et al. |
| 8,488,877 B1 | 7/2013 | Owechko et al. |
| 8,503,046 B2 | 8/2013 | Mikkelsen et al. |
| 8,605,998 B2 | 12/2013 | Samples et al. |
| 8,620,089 B1 | 12/2013 | Korah et al. |
| 8,665,122 B2 | 3/2014 | Klepsvik |
| 8,773,182 B1 | 7/2014 | Degani et al. |
| 8,798,372 B1 | 8/2014 | Korchev et al. |
| 9,076,219 B2 | 7/2015 | Cha et al. |
| 9,097,804 B1 | 8/2015 | Silver et al. |
| 9,098,753 B1 | 8/2015 | Zhu et al. |
| 9,128,190 B1 | 9/2015 | Ulrich et al. |
| 9,369,697 B2 | 6/2016 | Kumagai et al. |
| 9,383,753 B1 | 7/2016 | Templeton et al. |
| 9,396,545 B2 | 7/2016 | Fu et al. |
| 9,470,548 B2 | 10/2016 | Ahn et al. |
| 9,584,748 B2 | 2/2017 | Saito |
| 9,606,228 B1 | 3/2017 | Wise |
| 9,644,857 B1 | 5/2017 | Ashgriz et al. |
| 9,659,378 B2 | 5/2017 | Sasaki et al. |
| 2004/0135992 A1 | 7/2004 | Munro |
| 2005/0248749 A1 | 11/2005 | Kiehn et al. |
| 2005/0254628 A1 | 11/2005 | Saladin et al. |
| 2007/0214687 A1 | 9/2007 | Woon et al. |
| 2007/0296951 A1 | 12/2007 | Kuijk et al. |
| 2008/0114253 A1 | 5/2008 | Randall et al. |
| 2008/0319706 A1 | 12/2008 | Uffenkamp et al. |
| 2009/0310867 A1 | 12/2009 | Matei et al. |
| 2010/0271615 A1 | 10/2010 | Sebastian et al. |
| 2011/0285981 A1 | 11/2011 | Justice et al. |
| 2012/0032541 A1 | 2/2012 | Chen et al. |
| 2012/0121166 A1 | 5/2012 | Ko et al. |
| 2012/0170024 A1 | 7/2012 | Azzazy et al. |
| 2012/0170029 A1 | 7/2012 | Azzazy et al. |
| 2012/0248288 A1 | 10/2012 | Linder et al. |
| 2012/0256916 A1 | 10/2012 | Kitamura et al. |
| 2013/0107243 A1 | 5/2013 | Ludwig et al. |
| 2013/0188766 A1 | 7/2013 | Williams |
| 2013/0284475 A1 | 10/2013 | Hirabayashi et al. |
| 2013/0329065 A1 | 12/2013 | Haraguchi et al. |
| 2014/0049765 A1 | 2/2014 | Zheleznyak et al. |
| 2014/0071121 A1 | 3/2014 | Russ et al. |
| 2014/0132723 A1 | 5/2014 | More |
| 2014/0368651 A1 | 12/2014 | Irschara et al. |
| 2015/0185313 A1 | 7/2015 | Zhu |
| 2015/0206023 A1 | 7/2015 | Kochi et al. |
| 2015/0219920 A1 | 8/2015 | Ando et al. |
| 2016/0070981 A1 | 3/2016 | Sasaki et al. |
| 2016/0154999 A1 | 6/2016 | Fan et al. |
| 2016/0311528 A1 | 10/2016 | Nemovi et al. |
| 2016/0327779 A1 | 11/2016 | Hillman |
| 2017/0046840 A1 | 2/2017 | Chen et al. |
| 2017/0046845 A1 | 2/2017 | Boyle et al. |
| 2017/0153319 A1 | 6/2017 | Villeneuve et al. |
| 2017/0155225 A1 | 6/2017 | Villeneuve et al. |
| 2017/0178352 A1 | 6/2017 | Harmsen et al. |
| 2017/0227628 A1 | 8/2017 | Zheleznyak et al. |
| 2017/0248698 A1 | 8/2017 | Sebastian et al. |
| 2017/0316701 A1 | 11/2017 | Gil et al. |

FOREIGN PATENT DOCUMENTS

| | | |
|---|---|---|
| CN | 202182717 U | 4/2012 |
| CN | 102508255 | 6/2012 |
| CN | 102944224 A | 2/2013 |
| CN | 102971657 | 3/2013 |
| CN | 103257342 A | 8/2013 |
| CN | 103257348 A | 8/2013 |
| CN | 103403577 A | 11/2013 |
| CN | 103499819 | 1/2014 |
| CN | 103969637 A | 8/2014 |
| CN | 103983963 A | 8/2014 |
| CN | 104463872 A | 3/2015 |
| CN | 104600902 A | 5/2015 |
| CN | 105517903 A | 4/2016 |
| CN | 105628026 A | 6/2016 |
| CN | 105759253 A | 7/2016 |
| CN | 106019296 A | 10/2016 |
| CN | 106019923 A | 10/2016 |
| CN | 106030431 | 10/2016 |
| CN | 106063089 A | 10/2016 |
| CN | 106093958 | 11/2016 |
| CN | 106093963 A | 11/2016 |
| CN | 106199622 A | 12/2016 |
| CN | 106597414 A | 4/2017 |
| CN | 106597416 A | 4/2017 |
| CN | 203645633 | 6/2017 |
| CN | 107037721 A | 8/2017 |
| JP | 63194211 A | 8/1988 |
| JP | 2002199682 A | 7/2002 |
| JP | 2005321547 A | 11/2005 |
| JP | 2015200555 A | 11/2015 |
| JP | 6076541 | 2/2017 |
| KR | 101665938 B1 | 10/2016 |
| WO | 2015148824 A1 | 10/2015 |
| WO | 2016127357 A1 | 8/2016 |
| WO | 2016170333 A1 | 10/2016 |
| WO | 2017021778 A2 | 2/2017 |

OTHER PUBLICATIONS

Douillard et al., "On the Segmentation of 3D LIDAR Point Clouds," (2011), 8 pages.
Hackel et al., "Fast Semantic Segmentation of 3D Point Clouds with Strongly Varying Density," (2016), 8 pages.
Levinson et al., "Automatic Online Calibration of Cameras and Lasers," (2013), 8 pages.
Liu et al., "A 3.9 ps RMS Resolution Time-To-Digital Converter Using Dual-sampling Method on Kintex UltraScale FPGA," (2006), 2 pages.
Montemerlo et al., "Junior: The Stanford Entry in the Urban Challenge," (2008), 31 pages.
Palka et al., "A Novel Method Based Solely on FPGA Units Enabling Measurement of Time and Charge of Analog Signals in Positron Emission Tomography," (2014), 6 pages.
Raismian, "Google Cars Autonomous Driving," (2017), 1 page.
Schwarze, "A New Look at Risley Prisms," (2006), 5 pages.

(56) References Cited

OTHER PUBLICATIONS

Tongtong et al., "Gaussian-Process-Based Real-Time Ground Segmentation for Autonomous Land Vehicles," (2014), 25 pages.
Wu et al., "Several Key Issues on Implementing Delay Line Based TDCs using FPGA," (2009), 6 pages.
International Searching Authority, International Search Report and Written Opinion of the International Searching Authority, PCT/CN2017/100040, dated May 29, 2018, 11 pages.
Partial Supplementary European Search Report dated Mar. 11, 2019, in counterpart European Application No. 17832172.5 (12 pages).
Supplementary European Search Report dated Jun. 18, 2019, in counterpart European Application No. 17832172.5 (11 pages).

DELAY TIME CALIBRATION OF OPTICAL DISTANCE MEASUREMENT DEVICES, AND ASSOCIATED SYSTEMS AND METHODS

CROSS REFERENCE TO RELATED APPLICATION

The present application is a continuation of International Patent Application No. PCT/CN17/100040, filed Aug. 31, 2017, which is incorporated here by reference.

BACKGROUND

Unmanned vehicles such as unmanned aerial vehicles (UAVs) can be used in in many applications, including crop surveillance, photography, inspection of buildings and other structures, fire and safety missions, border patrols, and product delivery, among others. Such unmanned vehicles may be equipped with sensors for detecting obstacles and other objects in the surrounding environment. LIDAR systems can be used to provide distance measurements for three-dimensional obstacle detection and environmental mapping. However, the measurement precision of existing LIDAR systems may not be sufficient for use in some complex environments. Accordingly, there remains a need for improved techniques for implementing LIDAR systems carried by unmanned vehicles and other movable objects.

DETAILED DESCRIPTION

1. Overview

Figure 1A:
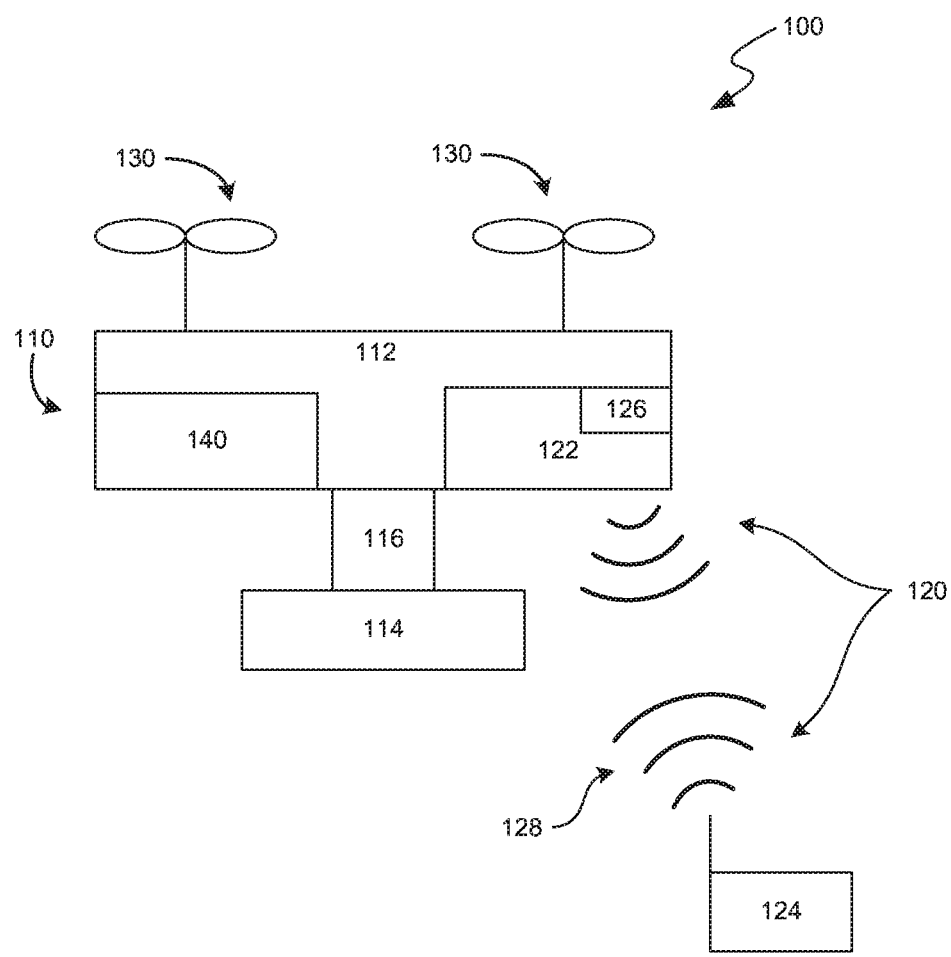
FIG. 1A is a schematic illustration of a representative system including a movable object configured in accordance with representative embodiments of the present technology.

The present technology is directed generally to calibrating delay times in optical distance measurement devices, and associated systems and methods. In some embodiments, a field-programmable gate array (FPGA) is configured to measure timing information for light pulses received by a light detection and ranging (LIDAR) system with increased time resolution (e.g., picosecond-level resolution). In some embodiments, the FPGA includes a time-to-digital converter (TDC) having a series of sequentially coupled delay units, and the FPGA is calibrated to account for individual delay times associated with individual delay units. Unlike conventional systems, embodiments of the present technology herein provide improved distance measurement accuracy (e.g., centimeter-level accuracy) with reduced cost, power consumption, and processing burden. Additionally, the present technology can be integrated into a wide variety of movable objects, including but not limited to unmanned vehicles, autonomous vehicles, and robots. Accordingly, the embodiments described herein are particularly advantageous for applications which involve high accuracy distance measurements in complex and dynamic environments, such as obstacle detection and environmental mapping performed by autonomous or semi-autonomous vehicles.

In the following description, numerous specific details are set forth to provide a thorough understanding of the presently disclosed technology. In other embodiments, the techniques introduced here can be practiced without these specific details. In other instances, well-known features, such as specific fabrication techniques, are not described in detail in order to avoid unnecessarily obscuring the present disclosure. References in this description to "an embodiment," "one embodiment," or the like, mean that a particular feature, structure, material, or characteristic being described is included in at least one embodiment of the present disclosure. Thus, the appearances of such phrases in this specification do not necessarily all refer to the same embodiment. On the other hand, such references are not necessarily mutually exclusive either. Furthermore, the particular features, structures, materials, or characteristics can be combined in any suitable manner in one or more embodiments. Also, it is to be understood that the various embodiments shown in the Figures are merely illustrative representations and are not necessarily drawn to scale.

As used herein "A and/or B" encompasses one or more of "A" or "B," and combinations thereof, such as "A" and "B."

In the following description, although some embodiments are introduced in connection with an unmanned aerial vehicle (UAV), the techniques herein are also applicable in a similar manner to other types of movable objects, including but not limited to other types of unmanned vehicles (e.g., ground vehicles), autonomous vehicles (e.g., self-driving cars), hand-held devices, or robots.

FIGS. 1A-13 are provided to illustrate representative embodiments of the disclosed technology. Unless provided for otherwise, the drawings are not intended to limit the scope of the claims in the present application.

Some of the embodiments of the technology described herein may take the form of computer- or controller-executable instructions, including routines executed by a programmable computer or controller. Those skilled in the relevant art will appreciate that the technology can be practiced on computer or controller systems other than those shown and described below. The technology can be embodied in a special-purpose computer or data processor that is specifically programmed, configured, or constructed to perform one or more of the computer-executable instructions described below. Accordingly, the terms "computer" and "controller" as generally used herein refer to any data processor and can include Internet appliances and handheld devices (including palm-top computers, wearable computers, cellular or mobile phones, multi-processor systems, processor-based or programmable consumer electronics, network computers, mini computers, and the like). Information handled by these computers and controllers can be presented at any suitable display medium, including a CRT display or LCD.

Some of the embodiments herein are described in the general context of methods or processes, which may be implemented in some embodiments by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Therefore, the computer-readable media can include a non-transitory storage media. Generally, program modules may include routines, programs, objects, components, data structures, etc. that perform particular tasks or implement particular abstract data types. Computer- or processor-executable instructions, associated data structures, and program modules represent examples of program code for executing steps of the methods disclosed herein. The particular sequence of such executable instructions or associated data structures represents examples of corresponding acts for implementing the functions described in such steps or processes.

Some of the embodiments herein can be implemented as devices or modules using hardware circuits, software, or combinations thereof. For example, a hardware circuit implementation can include discrete analog and/or digital components that are, for example, integrated as part of a printed circuit board. Alternatively, or additionally, the disclosed components or modules can be implemented as an application-specific integrated circuit (ASIC) and/or as a field-programmable gate array (FPGA) device. Some implementations may additionally or alternatively include a digital signal processor (DSP) that is a specialized microprocessor with an architecture optimized for the operational needs of digital signal processing associated with the disclosed functionalities of this application. Similarly, the various components or sub-components within each module may be implemented in software, hardware or firmware. The connectivity between the modules and/or components within the modules may be provided using any one of the connectivity methods and media known in the art, including, but not limited to, communications over the Internet, wired, or wireless networks using the appropriate protocols.

2. Representative Embodiments

FIG. 1A is a schematic illustration of a representative system 100 having elements configured in accordance with representative embodiments of the present technology. The system 100 includes a movable object 110 (e.g., a UAV) and a control system 120. The movable object 110 can be any suitable type of movable object that can be used in various embodiments, such as an unmanned vehicle, an autonomous vehicle, or a robot.

The movable object 110 can include a main body 112 (e.g., an airframe) that can carry a payload 114. Many different types of payloads can be used in accordance with the embodiments described herein. In some embodiments, the payload includes one or more sensors, such as an imaging device or an optoelectronic scanning device. For example, the payload 114 can be a camera, a video camera, and/or a still camera. The camera can be sensitive to wavelengths in any of a variety of suitable bands, including visual, ultraviolet, infrared and/or other bands. The payload 114 can also include other types of sensors and/or other types of cargo (e.g., packages or other deliverables).

In some embodiments, the payload 114 is supported relative to the main body 112 with a carrying mechanism 116 (e.g., a gimbal). The carrying mechanism 116 can allow the payload 114 to be independently positioned relative to the main body 112. For instance, the carrying mechanism 116 can permit the payload 114 to rotate around one, two, three, or more axes. The carrying mechanism 116 can also permit the payload 114 to move linearly along one, two, three, or more axes. The axes for the rotational or translational movement may or may not be orthogonal to each other. For example, when the payload 114 includes an imaging device, the imaging device can be moved relative to the main body 112 via the carrying mechanism 116 to photograph, video or track a target.

The movable object 110 can include one or more propulsion units 130 configured to move the movable object 110 with respect to up to three degrees of freedom of translation and/or up to three degrees of freedom of rotation. For example, in embodiments where the movable object 110 is a UAV, the propulsion units 130 can allow the movable object 110 to take off, land, hover, and/or move in the air with respect to up to three degrees of freedom of translation and up to three degrees of freedom of rotation.

Various types of propulsion units are suitable for use with the embodiments herein. In some embodiments, the propulsion units 130 include one or more rotors. The rotors can include one or more rotor blades coupled to a shaft. The rotor blades and shaft can be rotated by a suitable drive mechanism. For example, the propulsion units 130 can be driven by any suitable motor, such as a DC motor (e.g., brushed or brushless) or an AC motor. The motor can be configured to mount and drive a rotor blade. Although the propulsion units 130 of the movable object 110 are depicted as propeller-based and can have four rotors, any suitable number, type, and/or arrangement of propulsion units can be used. For example, the number of rotors can be one, two, three, four, five, or more. The rotors can be oriented vertically, horizontally, or at any other suitable angle with respect to the movable object 110. The angle of the rotors can be fixed or variable.

The movable object 110 is configured to receive control commands from the control system 120 and/or transmit data to the control system 120. In the embodiment shown in FIG. 1A, the control system 120 includes some components carried on the movable object 110 and some components positioned off the movable object 110. For example, the control system 120 can include a first controller 122 carried by the movable object 110 and a second controller 124 (e.g., a human-operated, remote controller) positioned remote from the movable object 110 and connected via a communication link 128 (e.g., a wireless link such as a radio frequency (RF) based link). The first controller 122 can include a computer-readable medium 126 that executes instructions directing the actions of the movable object 110, including, but not limited to, operation of the propulsion units 180 and the payload 162 (e.g., a camera). The second controller 124 can include one or more input/output devices, e.g., a display and control buttons. In some embodiments, the operator manipulates the second controller 124 to control the movable object 110 remotely, and receives feedback from the movable object 110 via the display and/or other interfaces on the second controller 124. In some embodiments, the movable object 110 operates autonomously, in which case the second controller 124 can be eliminated, or can be used solely for operator override functions.

In order to provide for safe and efficient operation, it may be beneficial for UAVs and other types of unmanned vehicles to be able to autonomously or semi-autonomously detect obstacles and/or to engage in evasive maneuvers to avoid obstacles. Additionally, sensing environmental objects can be useful for UAV functions such as navigation, target tracking, and mapping, particularly when the UAV is operating in a semi-autonomous or fully autonomous manner.

Accordingly, the UAVs described herein can include one or more sensors (e.g., separate and independent from payload-type sensors) configured to detect objects in the environment surrounding the UAV. In some embodiments, the UAV includes a sensor configured to measure the distance between an object and the UAV, referred to herein as a "distance measurement device" (e.g., distance measurement device 140 of FIG. 1A). The distance measurement device can be carried by the UAV in various ways, such as above, underneath, on the side(s) of, or within the main body of the UAV. Optionally, the distance measurement device can be coupled to the UAV via a gimbal or other carrying mechanism that permits the device to be translated and/or rotated relative to the UAV.

In some embodiments, the distance measurement device is an optical distance measurement device that uses light to measure distance to an object. The optical distance measurement device can be a LIDAR system or a laser rangefinder. LIDAR systems and laser rangefinders measure the distance between the device and an object by emitting a light signal (e.g., a laser pulse), detecting the light signal reflected back from the object, and determining the distance to the object based on the speed of light and the time elapsed between transmission and detection. A laser rangefinder provides one-dimensional distance data, while a LIDAR system can provide three-dimensional data of the surrounding environment by emitting the light signal over a plurality of different angles. Although some embodiments are described herein in terms of LIDAR systems, this is for illustrative purposes only, and the present technology can also be applied to other types of optical distance measurement devices, such as laser rangefinders. Additionally, although some embodiments described herein are particularly applicable to laser beams produced by laser diodes in a LIDAR system, other types of radiation sources (e.g., other types of lasers, or light emitting diodes (LEDs)) can be used in other embodiments.

Figure 1B:
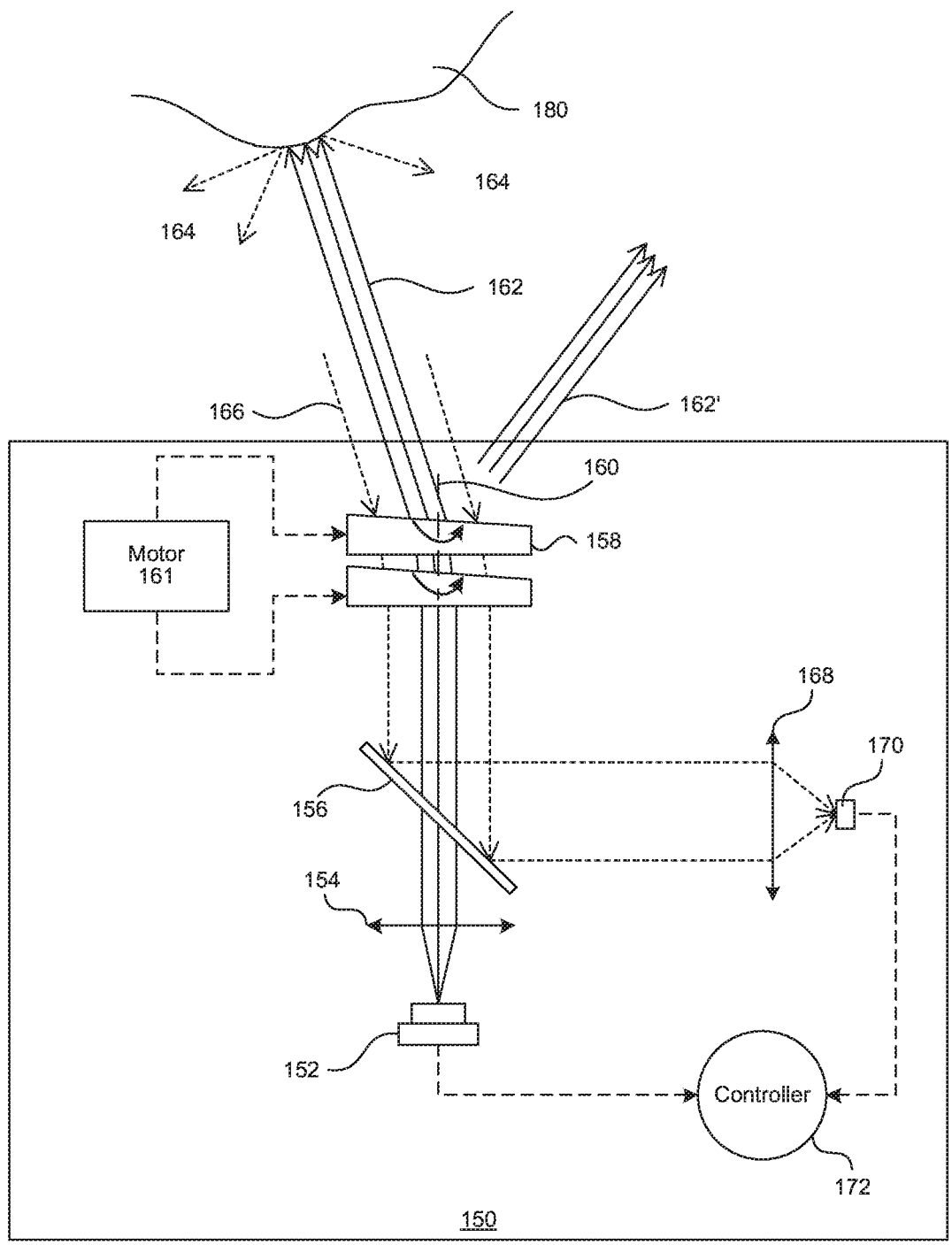
FIG. 1B is a schematic illustration of an representative LIDAR system configured in accordance with representative embodiments of the present technology.

FIG. 1B is a schematic illustration of a representative LIDAR system 150 configured in accordance with representative embodiments of the present technology. Some or all of the components of the LIDAR system 150 can be included in the distance measurement device 140 of FIG. 1A. The LIDAR system 150 detects the distance to the object 180 by measuring the time for light to travel between the LIDAR system 150 and the object 180, also known as the time-of-flight (TOF). The system 150 includes a light emitter 152 that can generate a laser beam (e.g., in the form of one or more light pulses). The laser beam can be a single laser pulse or a series of laser pulses. A lens 154 can be used for collimating the laser beam generated by the light emitter 152. The collimated light can be directed toward a beam splitting device 156. The beam splitting device 156 can allow the collimated light from the light source 152 to pass through. Alternatively, the beam splitting device 156 may not be necessary when different schemes are employed (e.g., when a light emitter is positioned in front of the detector).

The system 150 also includes a beam steering device 158 that can comprise various optical elements such as prisms, mirrors, gratings, optical phase arrays (e.g., liquid crystal-controlled gratings), or a combination thereof. These different optical elements can rotate about a common axis 160 in order to steer the light in different directions, as indicated by outgoing light beams 162 and 162'. The rotation of the optical elements can be actuated by a motor 161 or other suitable mechanism.

When the outgoing beam 162 hits the object 180, the reflected or scattered light may spread over a large angle 164 and only a fraction of the energy may be reflected back toward the system 150. The return beam 166 (e.g., in the form of one or more returning light pulses) can be reflected by the beam splitting device 156 toward a receiving lens 168, which can collect and focus the returned beam on a detector 170. The detector 170 receives the returned light and converts the light into electrical signals. A controller 172 including measuring circuitry, such as a TOF unit, can be used to measure the TOF in order to determine the distance to the object 180. Thus, the system 150 can measure the distance to the object 180 based on the time difference between generating the light pulse 162 by the light source 152 and receiving the return beam 166 by the detector 170.

In some embodiments, in order to obtain distance measurements with centimeter-level accuracy, the light pulses received by an optical distance measurement device such as a LIDAR system are sampled with a time resolution on the order of hundreds of picoseconds or even sub-hundreds of picoseconds. High resolution sampling is also beneficial to successfully capture very short pulse signals (e.g., with a pulse duration of only tens of nanoseconds to a few nanoseconds). Many LIDAR systems rely on high-speed analog-to-digital converters (ADCs) (e.g., with a sampling rate that exceeds one Giga sample per second (GSPS)) to perform the digitization of light pulse signals. However, high-speed ADCs are typically high cost and require high power consumption. Furthermore, high-speed ADC sampling is based on sampling analog signals with different voltages at the same time interval (i.e., sampling with respect to the time axis). As such, the timing of the sampling is independent from the pulse signal and without any time correlation, and an extraction algorithm is needed to extract the timing information of the analog signal.

The present technology provides methods of achieving high accuracy distance measurements that do not rely on the use of high-speed ADCs. In some embodiments, the systems and methods described herein are configured to provide high accuracy distance measurements using a field-programmable device, such as an FPGA or a complex programmable logic device (CPLD). Although representative embodiments herein are described with reference to FPGAs, the present technology can also be implemented using other types of field-programmable devices such as CPLDs.

An FPGA is an integrated circuit including a plurality of logic blocks that can be programmed by a user after the FPGA has been manufactured to provide a wide variety of different functionalities. In some embodiments, an FPGA includes an array of programmable logic blocks (e.g., configurable logic blocks (CLBs) or logic array blocks (LABs)) and input/output (I/O) blocks. The logic blocks and I/O blocks can be coupled to each other via programmable routing. A logic block can include a plurality of logic cells or slices. A logic cell or slice can include a plurality of components that can be configured by the user to implement logic functions, including but not limited to one or more look-up tables (LUTs) (e.g., 3-input or 4-input LUTs), flip-flops, multiplexers, and/or carry logic.

Accordingly, an FPGA can be configured to perform some of the operations involved in optical distance measurement, such as digitizing an analog pulse signal into a plurality of digital signal values (pulse digitization), determining a plurality of time values corresponding to the plurality of digital signal values (time-to-digital conversion), and calculating the object distance using the digital signal values and time values. The FPGA-based systems and methods described herein can be used to provide centimeter-level precision in distance measurements with relatively low cost and power consumption.

Figure 2:
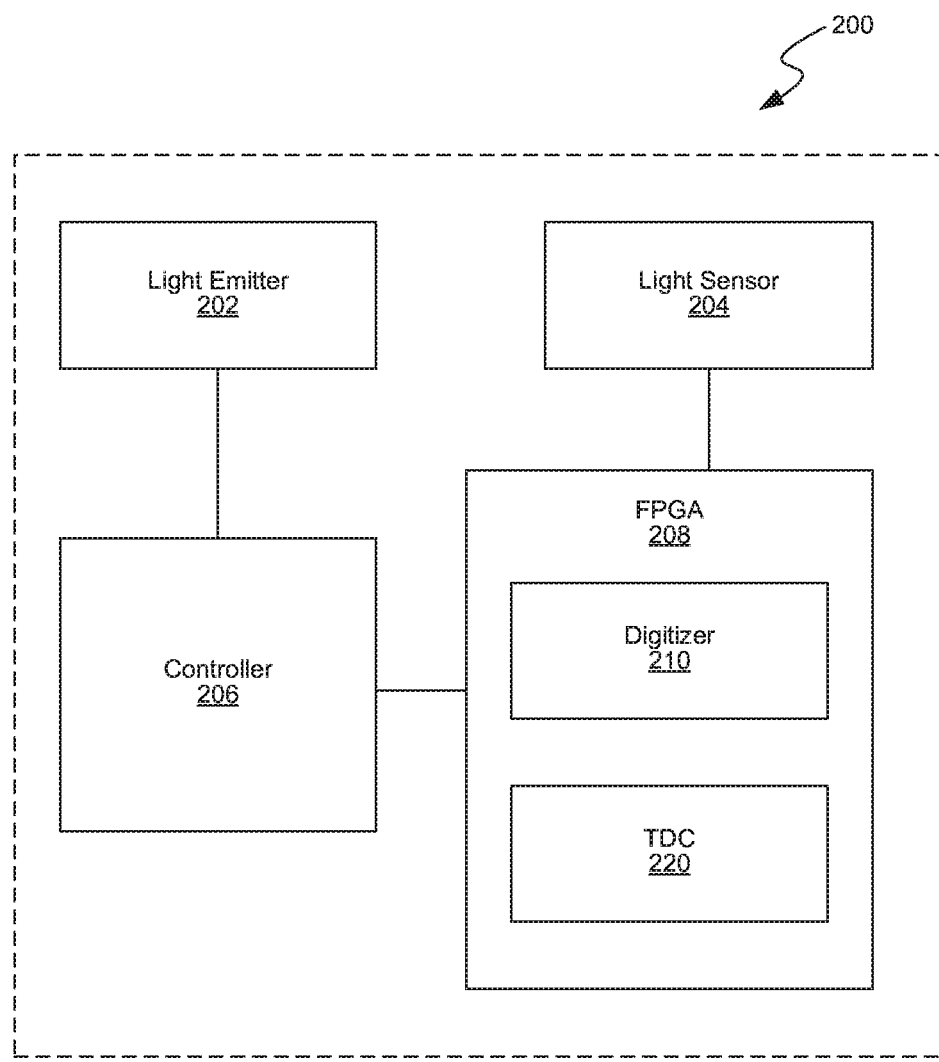
FIG. 2 is a schematic illustration of an field-programmable gate array (FPGA)-based optical distance measurement device configured in accordance with representative embodiments of the present technology.

FIG. 2 is a schematic illustration of an FPGA-based optical distance measurement device 200 configured in accordance with representative embodiments of the present technology. The optical distance measurement device can include some or all of the components of a LIDAR system, such as the system 150 described above with reference to FIG. 1B. In some embodiments, the device 200 includes a light emitter 202 configured to emit an outbound light pulse (e.g., a laser pulse), similar to the light emitter 152 of FIG. 1B, and a light sensor 204 configured to receive a returning light pulse reflected from an object (e.g., an object in the environment surrounding the device 200), similar to the light detector 170 of FIG. 1B. The light sensor 204 is configured to output an analog pulse signal representing the returning light pulse, e.g., using a photodetector that converts light energy into an electrical signal.

The device 200 includes an FPGA 208. The FPGA 208 is coupled to the light sensor 204 and configured to receive the analog pulse signal generated by the light sensor 204. The FPGA 208 can be configured to process the analog pulse signal in order to convert it into a digital signal and determine timing information. In some embodiments, the FPGA 208 includes a digitizer 210 configured to digitize the analog pulse signal into a plurality of digital signal values and/or a time-to-digital converter (TDC) 220 configured to determine a plurality of time values corresponding to the plurality of digital signal values. A digital signal value can represent a voltage level of the analog pulse signal, and the corresponding time value can represent a time point when the analog pulse signal is at that voltage level.

The device 200 can include a controller 206, e.g., a controller similar to the controller 172 of FIG. 1B. In some embodiments, the controller 206 is coupled to the light emitter 20 to control the emission of the outbound light pulse and measure timing information for when the outbound light pulse is emitted. The controller 206 can also be coupled to the FPGA 208 in order to receive the timing information for the returning light pulse and calculate the distance to the object based at least in part on the timing information. In some embodiments, the controller 206 receives the digital signal values and time values generated by the FPGA 208, and calculates the distance to the object based on the digital signal values and time values. For example, the controller 206 can be configured to calculate the object distance by inputting the digital signal values and time values into a function and deriving an estimated time value for the returning light pulse using the function. The estimated time value can then be used in a TOF calculation to determine the distance to the object.

The controller 206 can use many different types of functions to calculate the estimated time value. In some embodiments, the function is a pulse signal model, such as a polynomial or a triangular model. The controller 206 can fit the digital signal values and time values to the pulse signal model and derive an estimated time value based on the shape of the model. For example, the controller 206 can determine the estimated time value based on when the signal magnitude reaches its maximum. In some embodiments, the controller 206 can use other criteria, such as the width of the signal in a square signal model, to derive the estimated time value associated with the pulse signal.

In some embodiments, the controller 206 uses a search function to derive the estimated time value. The controller 206 can search in a database or a LUT to find a set of values that is the closest match to the digital signal values and time values. The set of values may have the form of $(t_i, Vf_i)$, where $Vf_i$ is a voltage level and $t_i$ is a time value corresponding to that voltage level. The set of values can map to an output time value or an output tuple in the form of $(T, V)$, that is stored in the database or LUT. The controller then can select the mapped output time value, or T from the mapped output tuple corresponding to V, to facilitate the computation of the TOF in order to determine the distance of the corresponding object from the device.

Some or all of the components of the device 200 can be carried by a movable object, such as an unmanned vehicle (e.g., a UAV), an autonomous vehicle (e.g., a self-driving car), or a robot. Thus, the device 200 can be used to measure the distances between the movable object and surrounding objects as the movable object operates within an environment. In some embodiments, the device 200 is particularly suitable for use in complex and dynamic environments, e.g., environments having many objects surrounding the device 200, environments in which obstacles are moving rapidly relative to the device 200, environments with fluctuating conditions such as temperature, and so on. The device 200 is also particularly suitable for use in conjunction with movable objects that are capable of rapid movement with respect to multiple degrees of freedom.

Although FIG. 2 illustrates a representative embodiment of a device for measuring distance using an FPGA, alternative configurations of the device 200 can also be used. For example, although FIG. 2 illustrates a single digitizer 210 and a single TDC 220, the FPGA 208 can also include multiple digitizers and/or multiple TDCs. Various combinations of digitizers and TDCs can be used, e.g., a single digitizer can be coupled to a respective single TDC, a single digitizer can be coupled to multiple TDCs, or a single TDC can be coupled to multiple digitizers.

As another example, in some embodiments, either the digitizer 210 or the TDC 220 may be optional, such that the pulse digitization process or time-to-digital conversion process is performed by a device other than the FPGA 208. For instance, the pulse digitization can be performed by one or more comparators, while the time-to-digital conversion is performed by the TDC 220 of the FPGA 208. Alternatively, pulse digitization can be performed by the digitizer 210 of the FPGA 208, while a device other than the FPGA 208 (e.g., a separate TDC) performs the time-to-digital conversion.

In yet another example, although the controller 206 is depicted in FIG. 2 as a separate device from the FPGA 208, in other embodiments, the controller 206 can be part of the FPGA 208. In such embodiments, the FPGA 208 is configured to perform some or all of the functions of the controller 206. For example, the FPGA 208 can be configured to perform the distance calculation using the digital signal values generated by the digitizer 210 and the time values generated by the TDC 220.

In some embodiments, the TDC 220 is implemented by configuring one or more components of the FPGA to receive a plurality of digital signal values representing a digitized analog pulse signal (e.g., generated by the digitizer 210), and sampling each digital signal value to generate a corresponding time value. In some embodiments, the FPGA receives and samples a square wave signal representing changes in the value of a digital signal value over time to determine time values for the rising and/or falling edges of the signal. The time values for the rising and/or falling edges of the square wave signal can represent the time points at which the analog pulse signal reaches, exceeds, and/or falls below a particular voltage value.

In some embodiments, the sampling is performed with a high time resolution, e.g., a time resolution on the order of hundreds of picoseconds or sub-hundreds of picoseconds. For example, the time resolution of the sampling can be in a range from about 5 picoseconds to about 2000 picoseconds, from about 10 picoseconds to about 1000 picoseconds, from about 1 picosecond to about 500 picoseconds, or from about 1 picosecond to about 100 picoseconds. In some embodiments, the time resolution of the sampling (e.g., on a picosecond level) is higher than the clock period of the FPGA clock (e.g., on a nanosecond level). For instance, the time resolution can be at least 2 times, 5 times, 10 times, 20 times, or 100 times higher than the clock period of the FPGA.

In some embodiments, the TDC 220 is configured to perform high time resolution sampling using a series of delay units. The delay units can be sequentially coupled to each other such that the digital signal value is sequentially propagated through the delay units, with each successive delay unit receiving a time-delayed version of the digital signal value from the preceding delay unit. Thus, the time value for the digital signal value can be determined by counting the number of delay units that have received the digital signal value in a known time interval.

Figure 3:
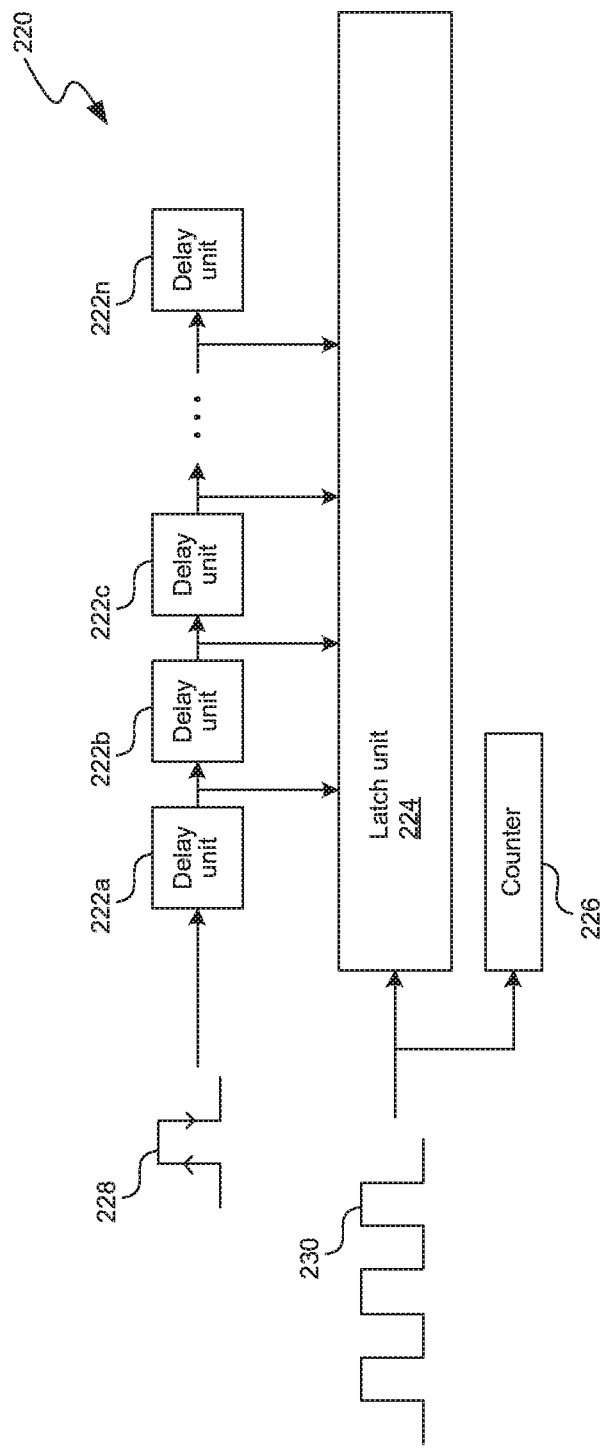
FIG. 3 is a schematic illustration of a time-to-digital converter (TDC) with a high time resolution configured in accordance with representative embodiments of the present technology.

FIG. 3 is a schematic illustration of the TDC 220 with a high time resolution configured in accordance with representative embodiments of the present technology. The TDC 220 can be implemented using one or more components of an FPGA (e.g., the FPGA 208) as previously discussed. In some embodiments, the TDC 220 includes a series of delay units 222a-222n sequentially coupled to each other to form a delay line. Any suitable number of delay units can be used, such as at least 10, at least 25, at least 50, at least 100, or at least 200 delay units. The delay units 222a-222n can be configured in various ways using the logic components within an FPGA. For example, the plurality of delay units 222a-222n can include a carry chain and/or an LUT.

In some embodiments, each delay unit produces a picosecond-level delay in signal transmission. The delay time can correspond to the length of time between when the delay unit first receives an input signal (e.g., from a preceding delay unit) and when the delay unit outputs the input signal (e.g., to the next delay unit). For example, each delay unit can be configured to produce a delay time within a range from about 5 picoseconds to about 2000 picoseconds, from about 10 picoseconds to about 1000 picoseconds, from about 1 picosecond to about 500 picoseconds, or from about 1 picosecond to about 100 picoseconds. In some embodiments, the delay produced by each delay unit is the same, such that the delay units have the same individual delay times. In other embodiments, some or all of the delay units produce different delays, such that some or all of the delay units have different individual delay times.

The delay units 222a-222n can be configured to receive a digital signal value corresponding to a digitization of an analog pulse signal. In some embodiments, the digital signal value represents whether the analog pulse signal is greater than, less than, or equal to a voltage level at a particular time. The digital signal value can be received as a square wave signal 228 representing changes in the digital signal value over time. The signal 228 can be sequentially transmitted through each of the delay units 222a-222n, such that the signal received by each successive delay unit is delayed from the signal received by the preceding delay unit by a corresponding delay time. Each delay unit can be configured to produce an output signal when it receives an edge of the signal 228. For example, the delay unit can output a digital "1" value when triggered by a rising edge of the signal 228, and can output a digital "0" value when triggered by a falling edge of the signal 228.

The delay units 222a-222n are coupled to a latch unit 224. The latch unit 224 can be configured to latch the outputs of the delay units 222a-222n when the delay units 222a-222n are triggered by the signal 228. In some embodiments, the latch unit 224 includes a plurality of latches, each of which is coupled to a corresponding delay unit and is configured to latch the output of that delay unit (e.g., by stably storing a digital data value representative of the output) when it is triggered by a rising or falling edge of the signal 228. The latched output of each delay unit constitutes the output signal of the latch unit 224.

The TDC 220 is configured to receive a clock signal 230 (e.g., from an clock of the FPGA 208). The clock signal 230 can have a rate on the order of hundreds of MHz to GHz, such that the signal 230 has a nanosecond-level clock period, $T_{ck}$. In some embodiments, the clock period corresponds to the length of a clock cycle (e.g., the length of time from a rising edge of the clock signal 230 to the next rising edge of the signal 230, or from a falling edge of the signal 230 to the next falling edge of the signal 230). The clock signal 230 can be received by the latch unit 224 and a counter 226. The counter 226 can count the number of clock cycles since the start of the measurement, $C_r$, such that the coarse time value provided by the TDC clock is $C_r T_{ck}$. At each clock cycle (e.g., prior to or at the time the TDC 220 receives the next edge of the clock signal 230), the TDC 220 can determine the number of delay units triggered by the signal 228 based on the latched output signal of the latch unit 224 to provide a high resolution time value corresponding to the rising or falling edge of the signal 228.

Figure 4A:
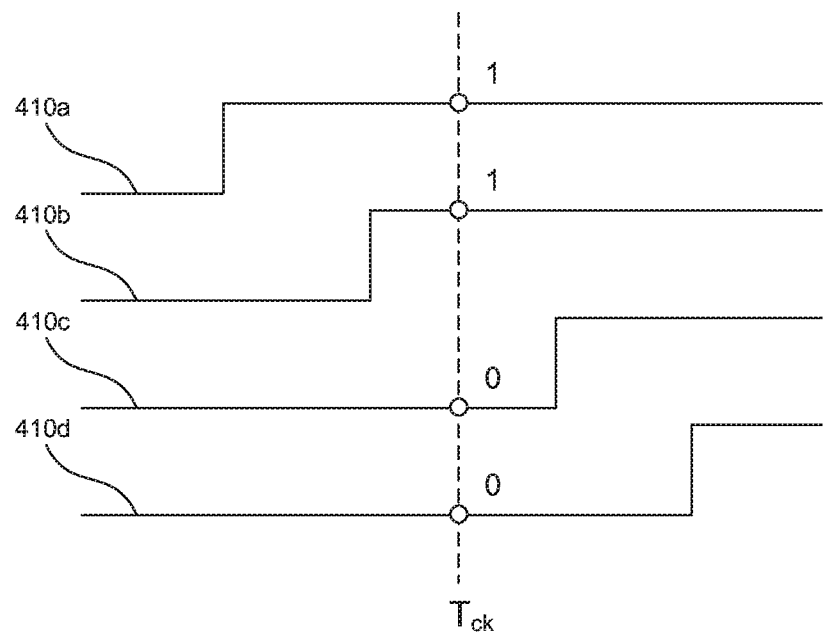
FIG. 4A is a timing diagram illustrating time measurement of a rising edge signal in accordance with representative embodiments of the present technology.

FIG. 4A is a timing diagram illustrating time measurement of a rising edge signal in accordance with representative embodiments of the present technology. In the depicted embodiment, the rising edge signal is transmitted through a series of four sequentially coupled delay units, such that the first delay unit receives signal 410a, the second delay unit receives signal 410b, the third delay unit receives signal 410c, and the fourth delay unit receives 410d. Each successive signal is delayed from the preceding signal by a corresponding delay time. At time $T_{ck}$, the latched output of each delay unit is sampled. In the depicted embodiment, the first and second delay units have already been triggered by the rising edge of signals 410a and 410b, respectively, such that the outputs of these delay units are both digital "1" data values. The third and fourth delay units have not yet been triggered by the rising edge of signals 410c and 410d, respectively, such that the outputs of these delay units are both digital "0" data values. Thus, the output signal of the latch unit (e.g., latch unit 224 of FIG. 3) at time $T_{ck}$ is "1100." The time value of the rising edge signal, $T_{rising}$, can be calculated based on the number of delay units that are latched at digital "1" data values, $C_{r1}$, using the relation $T_{rising}=C_r T_{ck}-C_{r1} t_d$, where $t_d$ is the average delay time across all delay units. For example, in the embodiment of FIG. 4A, there are two delay units latched at digital "1" data values, corresponding to signals 410a and 410b, such that the value of $C_{r1}$ is 2.

Figure 4B:
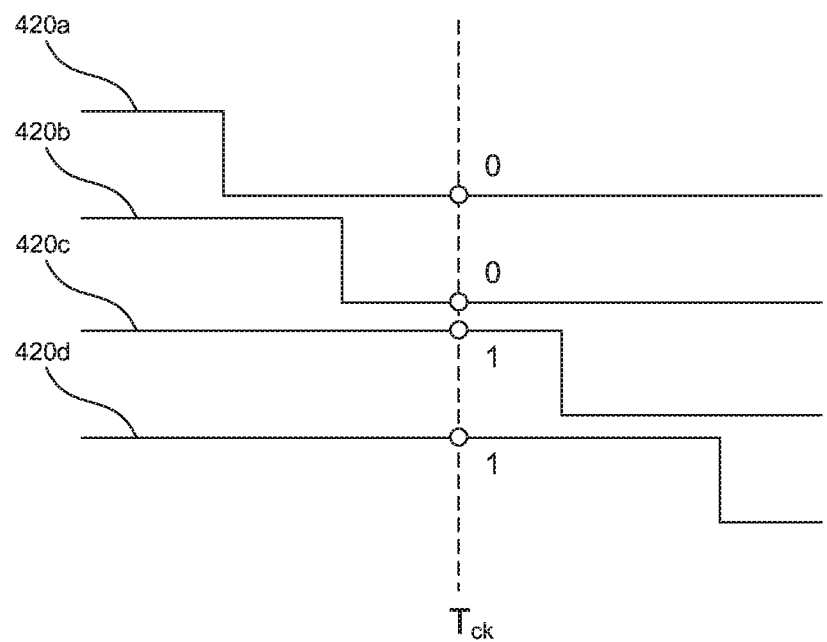
FIG. 4B is a timing diagram illustrating time measurement of a falling edge signal in accordance with representative embodiments of the present technology.

FIG. 4B is as timing diagram illustrating time measurement of a falling edge signal in accordance with representative embodiments of the present technology. In the depicted embodiment, the rising edge signal is transmitted through a series of four sequentially coupled delay units, such that the first delay unit receives signal 420a, the second delay unit receives signal 420b, the third delay unit receives signal 420c, and the fourth delay unit receives signal 420d. Each successive signal is delayed from the preceding signal by a corresponding delay time. At time $T_{ck}$, the latched output of each delay unit is sampled. In the depicted embodiment, the first and second delay units have already been triggered by the falling edge of signals 420a and 420b, respectively, such that the outputs of these delay units are both digital "0" data values. The third and fourth delay units have not yet been triggered by the falling edge of signals 420c and 420d, respectively, such that the outputs of these delay units are both digital "1" data values. Thus, the output signal by the latch unit 404 at time $T_{ck}$ is "0011." The time value of the falling edge signal, $T_{falling}$, can be calculated based on the number of delay units that are latched at digital "0" data values, $C_{f1}$, using the relation $T_{falling}=C_r T_{ck}-C_{f1} t_d$, where $t_d$ is the average delay time across all delay units. For example, in the embodiment of FIG. 4B, there are two delay units latched at digital "0" data values, corresponding to signals 420a and 420b, such that the value of $C_{f1}$ is 2.

Figure 5:
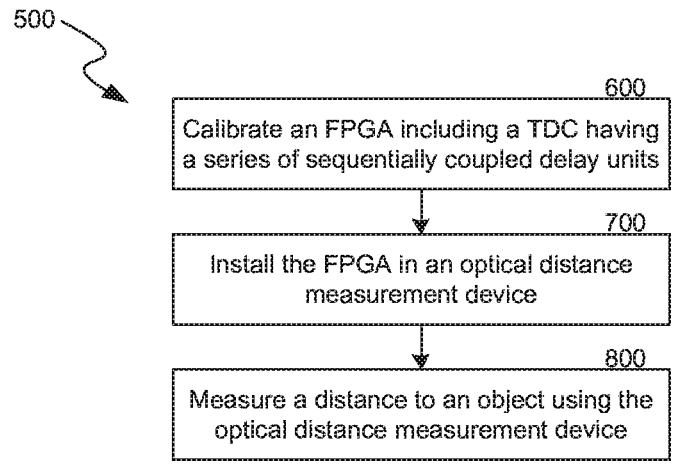
FIG. 5 is a flow diagram illustrating a method for manufacturing and operating an FPGA-based optical distance measurement device in accordance with representative embodiments of the present technology.

FIG. 5 is a flow diagram illustrating a method 500 for manufacturing and operating an FPGA-based optical distance measurement device in accordance with representative embodiments of the present technology. The method 500 can be used to manufacture and operate the optical distance measurement device 200, for example. Block 600 includes calibrating an FPGA (e.g., FPGA 208) including a TDC (e.g., TDC 220). The TDC has a series of sequentially coupled delay units. In some embodiments, calibrating the FPGA includes determining delay times associated with some or all of the delay units. The individual delay time can be an average delay time across multiple delay units, or can be an individual delay time that is determined separately for each delay unit. In some embodiments, calibrating the FPGA includes using a technique to reduce or eliminate "bubbles" in a data sequence used to determine the individual delay times for delay units. Representative methods for calibrating the FPGA are described in further detail with reference to FIGS. 6-10 below.

Block 700 includes installing the FPGA in an optical distance measurement device. In some embodiments, installing the FPGA includes coupling the FPGA to one or more components of an optical distance measurement device (e.g., device 200), such as a light emitter (e.g., light emitter 202), light sensor (e.g., light sensor 204), and/or a controller (e.g., controller 206).

Block 800 includes measuring a distance to an object using the optical distance measurement device. In some embodiments, the optical distance measurement device calculates the distance based at least in part on timing information for a pulse signal. For example, the timing information can include a plurality of time values corresponding to a plurality of digital signal values representing voltage levels of the pulse signal, as discussed above. In some embodiments, the timing information is measured using an FPGA including a TDC with a series of sequentially coupled delay units, and calibrated and installed in blocks 600 and 700. The FPGA can measure the timing information based at least in part on individual delay times of the delay units. Optionally, the timing information includes a time value for an input signal corresponding to one or more portions of the pulse signal, and measuring the timing information includes using a technique to reduce bubbles in a data sequence used to determine the time value. Exemplary methods for measuring the distance to an object are described in further detail with reference to FIGS. 11-13 below.

Although FIG. 5 illustrates the calibration process (block 600), installation process (block 700), and measurement process (block 800) as being part of a single method 500, in some embodiments these processes are independent of each other and can be performed by separate entities. For example, the calibration process and installation process can be performed by a manufacturer, while the measurement process can be performed by an end user. Additionally, the process order can be varied. For example, the installation process can be performed prior to the calibration process. In some embodiments, one or more processes are repeated. For example, an initial calibration process can be performed by a manufacturer, and an end user can perform additional calibration processes before and/or after operating the measurement device.

Figure 6:
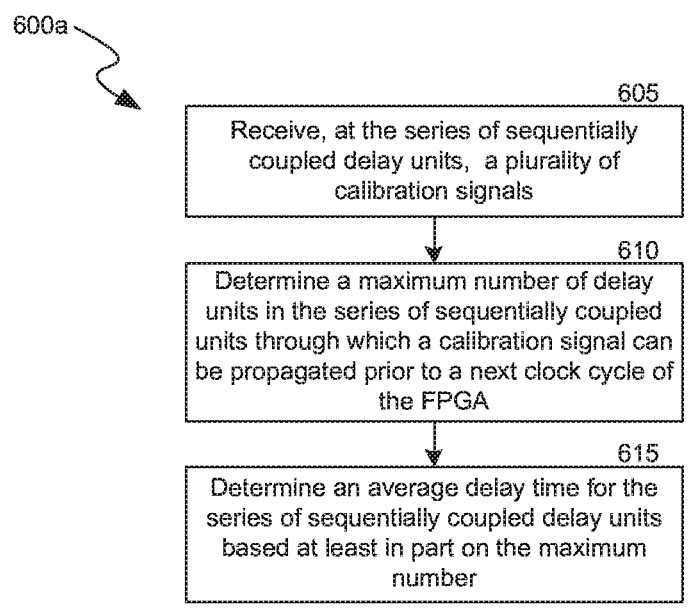
FIG. 6 is a flow diagram illustrating a method for calibrating an FPGA based on an average delay time in accordance with representative embodiments of the present technology.

FIG. 6 is a flow diagram illustrating a method 600a for calibrating an FPGA based on an average delay time in accordance with representative embodiments of the present technology. The method 600a is used to calibrate an FPGA (e.g., FPGA 208) including a TDC (e.g., TDC 220) having a series of sequentially coupled delay units. In some embodiments, some or all of the processes of the method 600a are performed as subprocesses in the calibration process (block 600) of FIG. 5.

Block 605 includes receiving, at the series of sequentially coupled delay units, a plurality of calibration signals. The calibration signals can be digital signals, such as a square wave signal including a rising edge and/or a falling edge. In some embodiments, the calibration signals are randomized signals, e.g., randomized with respect to timing. For example, the calibration signals can be digital square wave signals in which the timing of the rising and/or falling edges of the square wave signals are randomized. In some embodiments, the randomized signals are randomized with respect to a clock signal of the FPGA, such that the timing of the randomized signals is randomized with respect to the timing of the clock signal (e.g., the rising and/or falling edge of the signal can occur at any point in the clock cycle of the FPGA). The plurality of calibration signals can be sequentially received and propagated through the series of sequentially coupled delay units, such that the series receives a single calibration signal at a time and does not receive the next calibration signal until the previous signal has propagated through the series.

Block 610 includes determining a maximum number of delay units in the series of sequentially coupled delay units through which a calibration signal can be propagated prior to a next clock cycle of the FPGA. The maximum number is also referred to herein as "maxbin." In some embodiments, determining the maximum number includes propagating a calibration signal through the sequentially coupled delay units, generating a data sequence corresponding to the propagation of the signal through the series, and identifying the last delay unit in the series to receive the calibration signal prior to the next clock cycle. The identified delay unit can be the last delay unit to receive the signal. The determination of the maximum number can also include determining a count for each delay unit, with the count representing a number of times the delay unit is the last in the series to receive the signal. The counts for the series of sequentially coupled delay units can be used to determine the value of maxbin.

The data sequence can be generated in a variety of suitable ways. For example, as previously discussed, each delay unit can generate an output (e.g., a digital "1" value or digital "0" value") when it receives the calibration signal (e.g., a rising and/or falling edge of the signal), and the output can be latched by a corresponding latch (e.g., of the latch unit 224). Prior to the next FPGA clock cycle (e.g., before or at the time the TDC receives the next FPGA clock signal edge), the latched outputs are sampled and used to generate the data sequence. The data sequence can include a plurality of digital data values and each latched output can correspond to a digital data value in the data sequence. The position of the digital data value in the sequence can correspond to the position of the corresponding delay unit in the series, e.g., the first digital data value corresponds to the first delay unit, the second digital data value corresponds to the second delay unit, and so on.

The generated data sequence can be used to identify the last delay unit in the series that receives the calibration signal prior to the next clock cycle. For example, if the calibration signal is a rising edge signal, the data sequence can include a first segment of one or more digital "1" values (e.g., "11111"), corresponding to delay units that were triggered by the rising edge signal prior to the next clock cycle, followed by a second segment of one or more digital "0" values (e.g., "00000"), corresponding to delay units that were not triggered prior to the next clock cycle. Thus, the last digital "1" value in the first segment, (the digital "1" value immediately adjacent to the second segment) corresponds to the last delay unit to receive the calibration signal prior to the next clock cycle. In some embodiments, the first segment includes only one or more digital "1" values and the second segment includes only one or more digital "0" values.

As another example, if the calibration signal is a falling edge signal, the data sequence can include a first segment of one or more digital "0" values, corresponding to delay units that were triggered by the falling edge signal prior to the next clock cycle, followed by a second segment of one or more digital "1" values, corresponding to delay units that were not triggered prior to the next clock cycle. Thus, the last digital "0" value in the first segment, (the digital "0" value immediately adjacent to the second segment) corresponds to the last delay unit to receive the calibration signal prior to the next clock cycle. In some embodiments, the first segment includes only one or more digital "0" values and the second segment includes only one or more digital "1" values.

The count for each delay unit can be generated by recording the number of times the delay unit is identified as being the last unit to receive the signal. If the number of randomized calibration signals used is sufficiently large, it can be assumed that every delay unit in the series that is capable of receiving a signal prior to the next clock cycle (e.g., delay units where the cumulative preceding delay times do not exceed the clock period) will have a nonzero count, while the remaining delay units (e.g., delay units where the cumulative preceding delay times exceed the clock period) will have a count of zero. In some embodiments, the number of randomized calibration signals used is at least 100 times greater than the number of delay units in the series (e.g., 30,000 signals are used to calibrate an FPGA with 300 delay units). The value of maxbin thus corresponds to the position of the last delay unit in the series to have a nonzero count. For example, in a series of 100 sequentially coupled delay units, if delay units 1-50 have nonzero counts, and delay units 51-100 have zero counts, the value of maxbin is 50. In some embodiments, the series of sequentially coupled delay units is configured such that the value of maxbin will be less than the number of delay units in the series, and the cumulative delay time over the entire series exceeds the FPGA clock period.

Block 615 includes determining an average delay time for the series of sequentially coupled delay units based at least in part on the maximum number. In some embodiments, the average delay time is determined according to the relation $$t_d = T_{ck}/\text{maxbin}$$

where $t_d$ is the average delay time and $T_{ck}$ is the FPGA clock period. The average delay time can be used to measure timing information for an input signal, as discussed below with reference to FIGS. 11-13.

Figure 7:
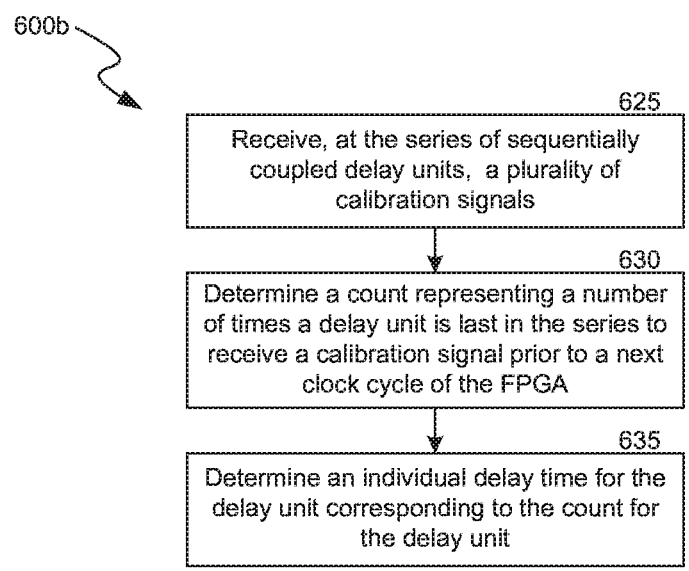
FIG. 7 is a flow diagram illustrating a method for calibrating an FPGA based on individual delay times in accordance with representative embodiments of the present technology.

FIG. 7 is a flow diagram illustrating a method 600b for calibrating an FPGA based on individual delay times in accordance with representative embodiments of the present technology. The method 600b is used to calibrate an FPGA (e.g., FPGA 208) including a TDC (e.g., TDC 220) having a series of sequentially coupled delay units. In some embodiments, some or all of the processes of the method 600b are performed as subprocesses in the calibration process (block 600) of FIG. 5. The method 600b can be advantageous for improving measurement accuracy in embodiments where some or all of the delay units have different individual delay times and using an average delay time would not provide sufficient accuracy.

Block 625 includes receiving, at the series of sequentially coupled delay units, a plurality of calibration signals. The receiving process can be performed as discussed above with reference to block 605 of FIG. 6.

Block 630 includes determining a count representing a number of times a delay unit is last in the series to receive a calibration signal prior to a next clock cycle of the FPGA. The count can be determined by propagating a calibration signal through the sequentially coupled delay units, generating a data sequence corresponding to the propagation of the signal through the series, and identifying the last delay unit in the series to receive the calibration signal prior to the next clock cycle, as discussed above with reference to block 610 of FIG. 6.

Block 635 includes determining an individual delay time for the delay unit corresponding to the count for the delay unit. In some embodiments, if the number of randomized calibration signals used is sufficiently large, the probability that a delay unit will be the last in the series to receive a signal will be proportional to its count, and the count will be proportional to its individual delay time.

Figure 8A:
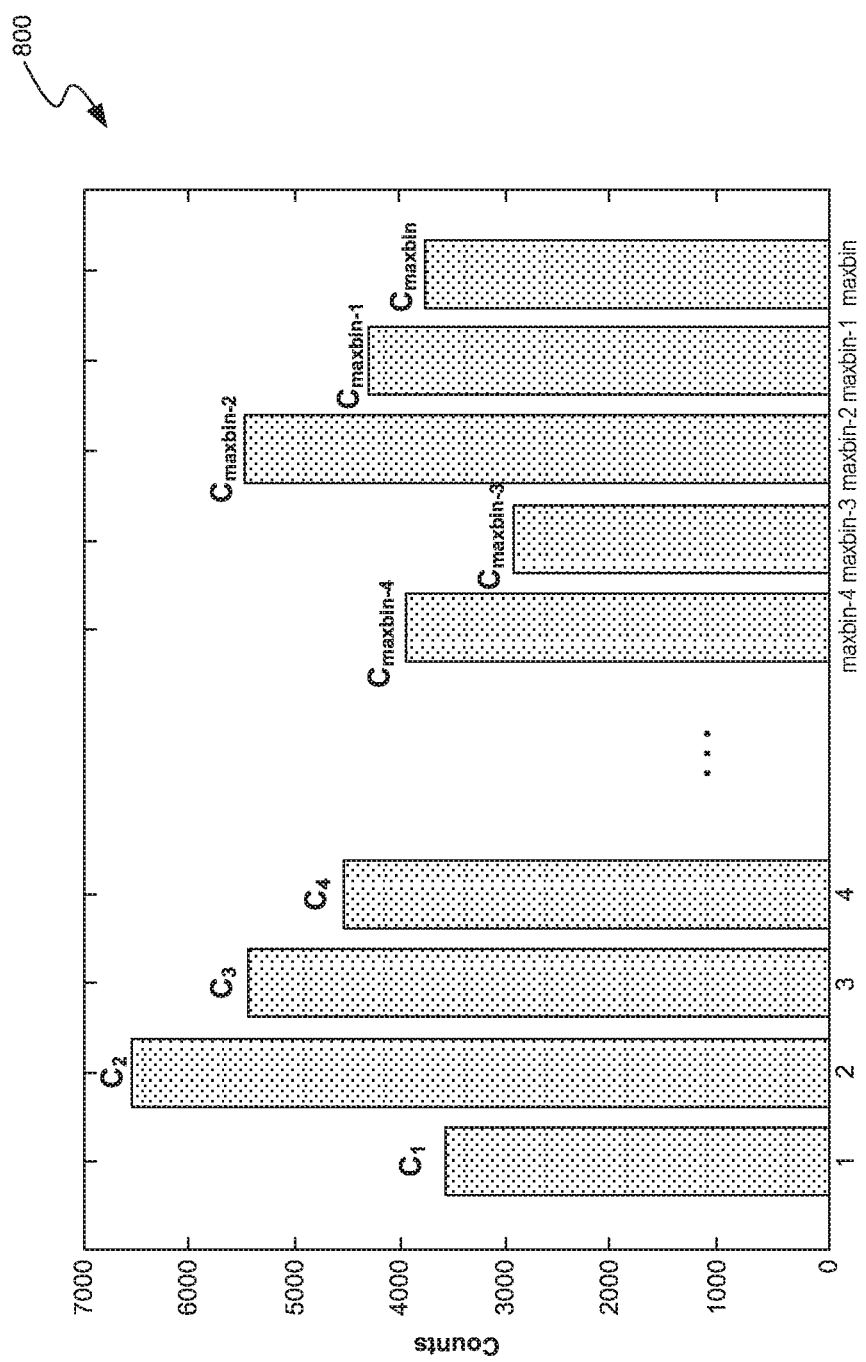
FIG. 8A is a histogram illustrating count data generated in accordance with representative embodiments of the present technology.
Figure 8B:
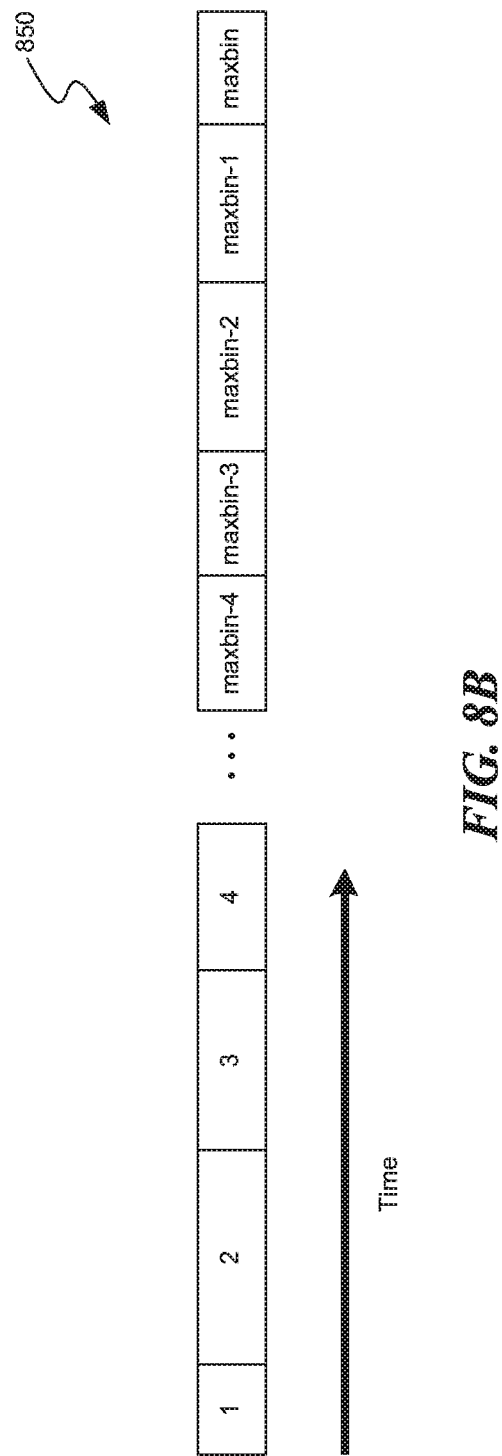
FIG. 8B is a schematic illustration of individual delay times of a series of sequentially coupled delay units in accordance with representative embodiments of the present technology.

FIGS. 8A and 8B present a representative embodiment of the proportionality between counts and individual delay times. FIG. 8A is a histogram 800 illustrating count data generated in accordance with representative embodiments of the present technology. The histogram 800 includes counts for a series of sequentially coupled delay units. In the illustrated embodiment, "1" corresponds to the 1st delay unit in the series and "maxbin" corresponds to the last delay unit in the series capable of receiving a signal prior to the next FPGA clock cycle. The bars in the histogram 800 represent the number of counts recorded for each delay unit, e.g., $C_1$ represents the count for the first delay unit, $C_2$ represents the count for the second delay unit, and so on, up to $C_{maxbin}$ representing the count for the (maxbin)th delay unit. In the illustrated embodiment, different delay units within the series have different counts.

FIG. 8B is a schematic illustration of individual delay times 850 of a series of sequentially coupled delay units corresponding to the count data of FIG. 8A in accordance with representative embodiments of the present technology. In the illustrated embodiment, the widths of the blocks (e.g., blocks 1, 2, 3, 4, . . . , maxbin-4, maxbin-3, maxbin-2, maxbin-1, and maxbin) represent the length of the individual delay time of the corresponding delay unit in the series. As can be seen in a comparison of FIGS. 8A and 8B, the width of each block is proportional to the corresponding count for the delay unit. For example, the first delay unit has a relatively low count, $C_1$, and block 1 has a relatively short width. As another example, the second delay unit has a relatively high count, $C_2$, and block 2 has a relatively short width.

Referring again to block 635 of FIG. 7, in some embodiments, the individual delay time for a delay unit is calculated based at least in part on a ratio representing the count of the corresponding delay unit divided by a sum of the counts of each of the sequentially coupled delay units. For example, the individual delay time for the ith delay unit in the series can be determined according to the relation $$t_{di} = C_i / \Sigma_{i=1}^{maxbin} C_i \times T_{ck}$$

where $t_{di}$ is the delay time for the ith delay unit, $T_{ck}$ is the FPGA clock period, and $C_i$ is the count for the i th delay unit. The individual delay times for the delay units can be subsequently used to measure timing information for an input signal, as discussed below with reference to FIGS. 11-13.

The accuracy of the calibration techniques described herein can be reduced if the counts for the delay units do not correctly reflect the number of times each delay unit was last in the series to receive a calibration signal. In some embodiments, such inaccuracies may occur if the data sequences used to determine the counts do not accurately correspond to the propagation of the calibration signals through the series, due to the presence of one or more "bubbles" in the data sequence. The bubble phenomenon and techniques for reducing the effects of bubbles are discussed with reference to FIGS. 9A-10 below.

Figure 9A:
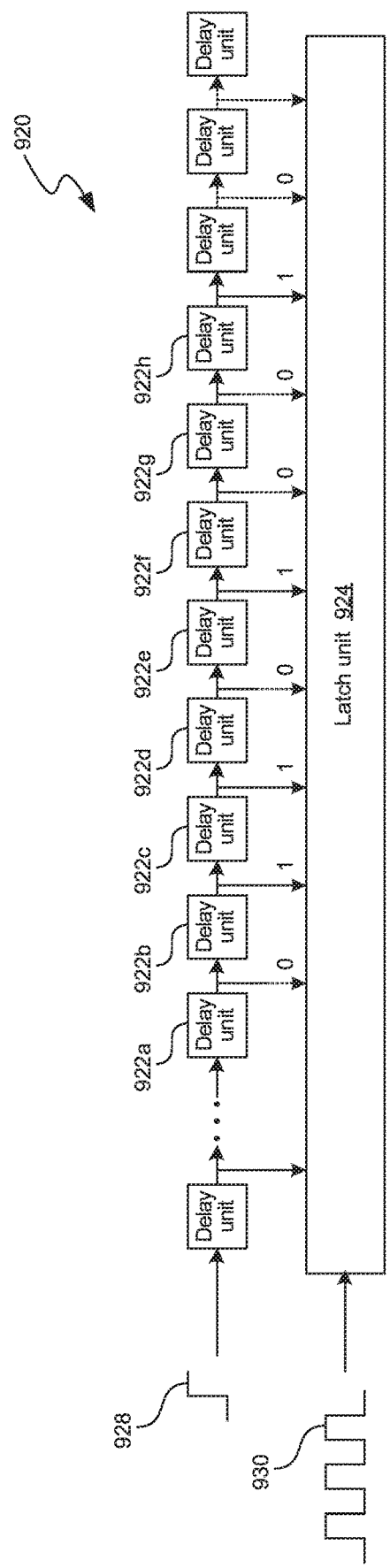
FIG. 9A is a schematic illustration of bubbles in a data sequence produced by a TDC in accordance with representative embodiments of the present technology.

FIG. 9A is a schematic illustration of bubbles in a data sequence produced by a TDC 920 in accordance with representative embodiments of the present technology. The TDC 920 can be similar to the TDC 220 of FIG. 2. The TDC 920 includes a series of delay units sequentially coupled to each other, such as delay units 922a-922h. The delay units are coupled to a latch unit 924 configured to latch the outputs of the delay units when they are triggered by receipt of an input signal 928. In some embodiments, the latch unit 924 includes a plurality of latches each coupled to a corresponding delay unit, such that each latch latches the output of the corresponding delay unit when the delay unit is triggered by the signal 928. For example, the latch can latch a digital "1" value when the delay unit is triggered by a rising edge signal and can latch a digital "0" value when the delay unit is triggered by a falling edge signal. The latched outputs of the latch unit 924 are sampled each clock cycle of the FPGA clock signal 930 (e.g., prior to or at the time the TDC receives the next clock signal edge).

In some embodiments, each of the latches is associated with a corresponding latching time for latching the output of the corresponding delay time. The latching time can correspond to the length of time between when the output of the delay unit changes (e.g., in response to being triggered by a rising edge or falling edge signal) and when the latch is able to latch the changed output. Some or all of the latches of the latch unit 924 can have different latching times, or some or all of the latches of the latching unit 924 can have the same latching times. For example, a latch can have a latching time within a range from about 1 picosecond to about 500 picoseconds.

The latching time can affect whether the output of the corresponding delay unit is successfully latched when the delay unit is triggered by an input signal 928. In some embodiments, if the latching time is less than or equal to the individual delay time of the corresponding delay unit, the latch can successfully latch the changed output before the signal is propagated to the next delay unit in the series. However, in some embodiments, if the latching time is greater than the individual delay time of the delay unit, the latch will not successfully latch the changed output before the signal propagates to the next delay unit. In some embodiments, the latch will be delayed in latching the changed output relative to other delay units in the series, such that the signal will have propagated through one or more delay units downstream before the output is latched.

Thus, in some embodiments, the latched outputs produced by the latch unit 924 may not accurately reflect the propagation of the input signal 928 through the series of delay units if one or more of the delay units have a latching time greater than the individual delay time. For example, in the illustrated embodiment, the signal 928 is received by delay units 922a-922h prior to a next clock cycle of the FPGA. The outputs of the delay units 922a-922h change from a digital "0" value to a digital "1" value when triggered by the signal 928. Delay units 922b, 922c, 922e, and 922h have latching times that are less than or equal to their individual delay times, such that their outputs are latched by the latch unit 924 as digital "1" values. Delay units 922a, 922d, 922f, and 922g having latching times that are greater than their individual delay times, such that their outputs are still latched as digital "0" values when the current clock cycle has ended even though they have received the signal 928.

The data sequence produced by a TDC in which at least some of the delay units have a latching time greater than the individual delay time can include a "bubble." In some embodiments, a bubble is least one digital "1" value between neighboring digital "0" values (e.g., "010" or "0110") or at least one digital "0" value between neighboring digital "1" values (e.g., "101" or "1001"). At least one digital data value of the bubble can correspond to a latched output of a delay unit having a latching time greater than its individual delay time. In some embodiments, a bubble segment includes one or more bubbles, e.g., at least one digital "1" value between neighboring digital "0" values, at least one digital "0" value between neighboring digital "1" values, or both. At least one digital data value of the bubble can correspond to a latched output of a delay unit having a latching time greater than its individual delay time. For example, in the embodiment of FIG. 9A, the bubble segment corresponding to the latched outputs of the delay units 922a-922h is "01101001."

Figure 9B:
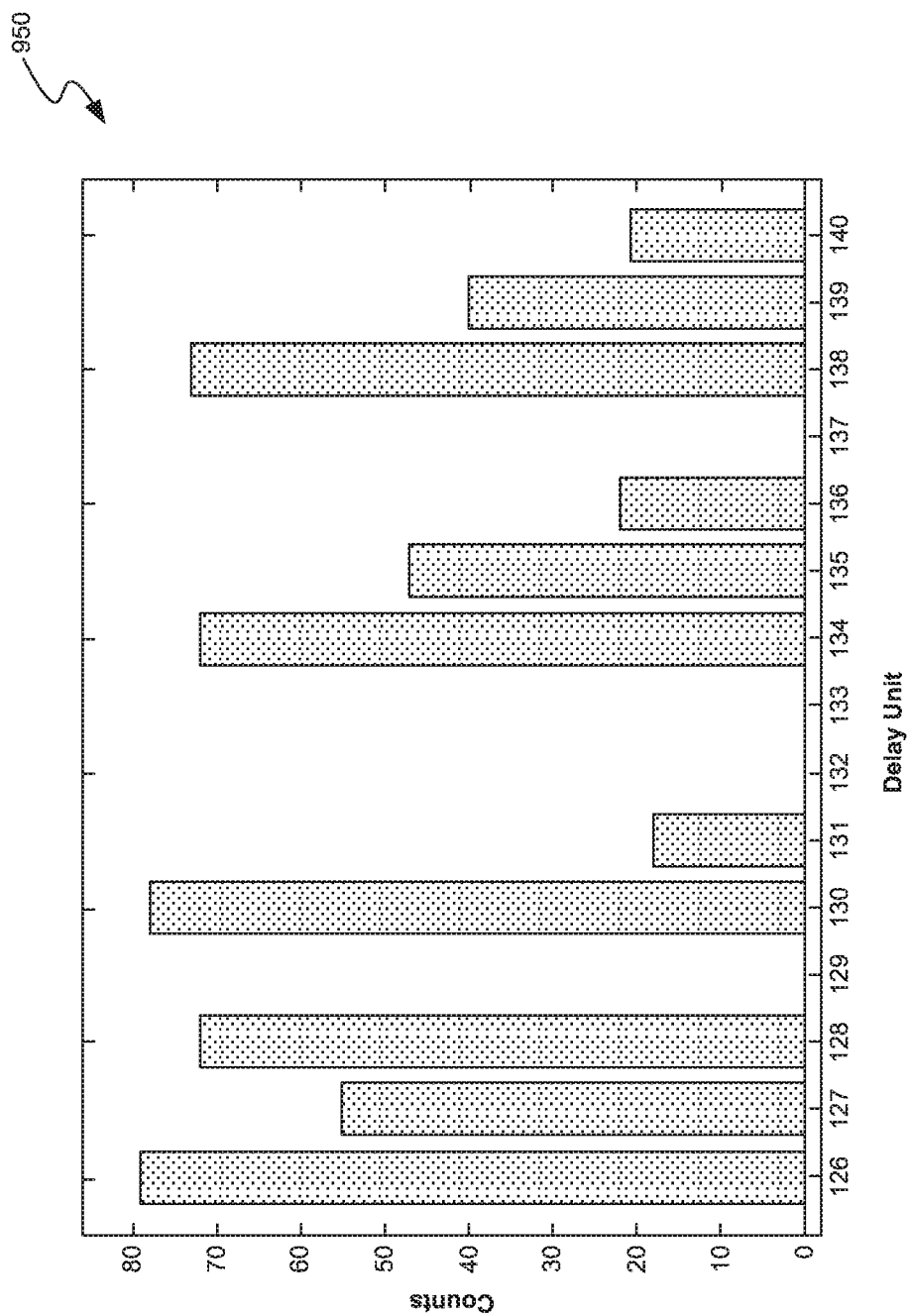
FIG. 9B is a histogram illustrating count data affected by bubbles in accordance with representative embodiments of the present technology.

FIG. 9B is a histogram 950 illustrating count data affected by bubbles in accordance with representative embodiments of the present technology. As discussed above with reference to FIGS. 6 and 7, the count for each delay unit can be generated by recording the number of times the delay unit is identified as being the last unit to receive a calibration signal. In some embodiments, a delay unit having a latching time longer than the individual delay time will not be correctly counted because its latched output will not indicate that the delay unit received the calibration signal. For example, in the histogram 950, delay units 129, 132, 133, and 137 have counts of zero because their latching times are longer than their individual delay times. In embodiments where the count is used to determine individual delay times, as discussed above with reference to FIG. 7, an erroneous count will reduce the accuracy with which the individual delay times are determined.

Figure 10:
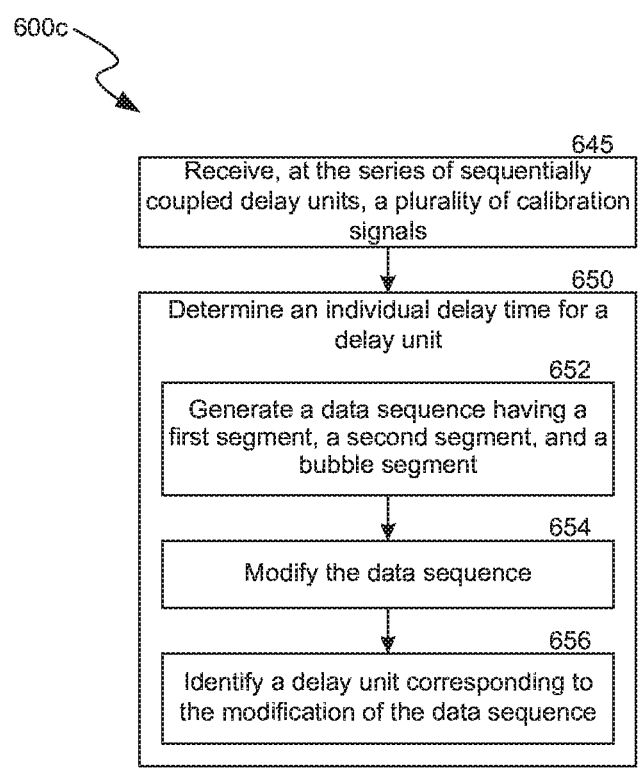
FIG. 10 is a flow diagram illustrating a method for calibrating an FPGA to reduce the effects of bubbles in accordance with representative embodiments of the present technology.

FIG. 10 is a flow diagram illustrating a method 600c for calibrating an FPGA to reduce or eliminate the effects of bubbles in accordance with representative embodiments of the present technology. The method 600c is used to calibrate an FPGA (e.g., FPGA 208) including a TDC (e.g., TDC 220) having a series of sequentially coupled delay units. In some embodiments, some or all of the processes of the method 600c are performed as subprocesses in the calibration process (block 600) of the FIG. 5. The method 600c can be advantageous for improving calibration accuracy in embodiments where some or all of the delay units have latching times greater than their individual delay times.

Block 645 includes receiving, at the series of sequentially coupled delay units, a plurality of calibration signals. The receiving process can be performed as discussed above with reference to block 605 of FIG. 5.

Block 650 includes determining an individual delay time for a delay unit. In some embodiments, the determination of the individual delay time is performed according to the methods discussed above with reference to FIGS. 6 and 7. For example, block 650 can include determining a count representing a number of times a delay unit is identified as being last in the series to receive a calibration signal prior to a next clock cycle of the FPGA, as described above with reference to block 610 of FIG. 6 and block 630 of FIG. 7. The count can be determined by propagating a calibration signal through the sequentially coupled delay units, generating a data sequence corresponding to the propagation of the signal through the series, and identifying the last delay unit in the series to receive the calibration signal prior to the next clock cycle, as described above with reference to block 610 of FIG. 6 and block 630 of FIG. 7. The individual delay time can be determined based at least in part on the count for the delay unit, as described above with reference to block 635 of FIG. 7.

In some embodiments, block 650 includes generating a data sequence having a first segment, a second segment, and a bubble segment (block 652). The data sequence can correspond to propagation of a calibration signal through the series of sequentially coupled delay units, as described above with reference to block 610 of FIG. 6 and block 630 of FIG. 7. For example, the data sequence can include or correspond to latched outputs of a latch unit coupled to the series of delay units, as described above with reference to block 610 of FIG. 6 and block 630 of FIG. 7.

In some embodiments, the first segment includes one or more digital "1" values. The first segment can include only digital "1" values, e.g., only one digital "1" value or only more than one digital "1" values, depending on the embodiment. In some embodiments, the second segment includes one or more digital "0" values. The second segment can include only digital "0" values, e.g., only one digital "0" value or only more than one digital "0" values, depending on the embodiment. The bubble segment can include at least one digital "1" data value between neighboring digital "0" values and/or at least one digital "0" value between neighboring digital "1" data values. The bubble segment can correspond to at least one delay unit having a latching time shorter than its individual delay time.

In some embodiments, the bubble segment is positioned between the first and second segments. The first segment can be positioned before the second segment, such that the first segment extends from the beginning of the data sequence to the bubble segment, and the second segment extends from the bubble segment to the end of the data sequence. The second segment can be positioned before the first segment, such that the second segment extends from the beginning of the data sequence to the bubble segment, and the first segment extends from the bubble segment to the end of the data sequence.

Block 650 can include modifying the data sequence (block 654). In some embodiments, the modification process involves reducing or eliminating one or more bubbles in the data sequence. For example, the modification process can include rearranging one or more digital data values of the bubble segment to reduce or eliminate bubbles. The modification process can include moving at least one digital "1" data value of the bubble segment toward the first segment (e.g., immediately adjacent to the first segment) and moving at least one digital "0" data value of the bubble segment toward the second segment (e.g., immediately adjacent to the second segment). In some embodiments, the modified data sequence includes a first segment of only digital "1" data values adjacent to a second segment of only digital "0" data values. For example, referring again to the embodiment of FIG. 9A, if the initial data sequence is "111110 110100100000," where the underlined numerals correspond to the bubble segment, the modified data sequence without the bubble segment can be "111111111000000000."

Block 650 can include identifying a delay unit corresponding to the modification of the data sequence (block 656). In some embodiments, the first segment is positioned before the second segment, and the identified delay unit corresponds to the last digital "1" data value of in the data sequence, or a digital "1" data value adjacent to the second segment (e.g., the digital "1" data value immediately adjacent to the second segment, such as the underlined numeral in "11110000"). In some embodiments, the second segment is positioned before the first segment, and the identified delay unit corresponds to the last digital "0" data value of in the data sequence, or a digital "0" data value adjacent to the first segment (e.g., the digital "0" data value immediately adjacent to the first segment, such as the underlined numeral in "00001111").

The identified delay unit can be used to calculate a count for the delay unit, as described above with reference to block 610 of FIG. 6 and block 630 of FIG. 7. In some embodiments, the identified delay unit can be considered to be the "last" delay unit in the series to receive the calibration signal prior to the next FPGA clock cycle for the purposes of calculating the count, even if it was not actually the last unit to receive the signal. The count can be used to determine the individual delay time for the delay unit, as described above with reference to block 635 of FIG. 7.

In some embodiments, the data sequence need not actually be modified in order to identify the delay unit, such that block 654 is optional. For example, the delay unit can be identified based on a second data sequence corresponding to or representing the modified data sequence. As another example, the delay unit can be identified by determining which delay unit would correspond to the last digital "1" data value or last digital "0" data value in the modified data sequence, such as by determining the total number of digital "1" data values or the total number of digital "0" data values in the sequence.

Although the methods 600a-600c are illustrated separately in FIGS. 6, 7, and 10, these methods can be also be performed in combination with each other, such that calibrating the FPGA (block 600 of FIG. 5) involves performing two or more of these methods sequentially or simultaneously. For example, the method 600b of FIG. 7 can be performed in combination with the method 600c of FIG. 10. In some embodiments, determining the count (block 630 of FIG. 7) includes generating a data sequence (block 652 of FIG. 10), modifying the data sequence (block 654 of FIG. 10), and/or identifying a delay unit corresponding to the modification (block 656 of FIG. 10).

Figure 11:
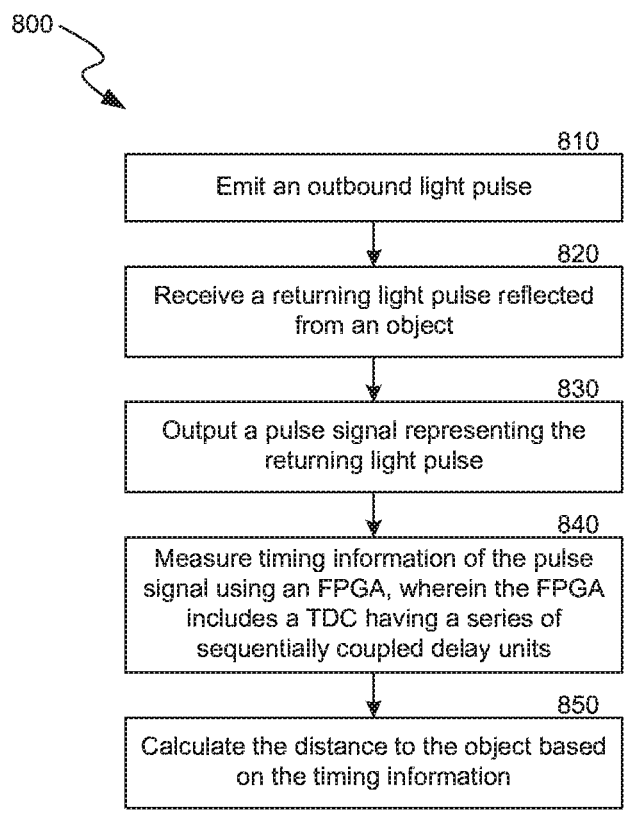
FIG. 11 is a flow diagram illustrating a method for measuring a distance to an object using an optical distance measurement device in accordance with representative embodiments of the present technology.

FIG. 11 is a flow diagram illustrating a method 800 for measuring a distance to an object using an optical distance measurement device in accordance with representative embodiments of the present technology. In some embodiments, some or all of the processes of the method 800 are performed as subprocesses in the measurement process (block 800) of FIG. 5.

Block 810 includes emitting an outbound light pulse. The light pulse can be emitted by a light emitter of a LIDAR system, e.g., light emitter 152 of FIG. 1B or light emitter 202 of FIG. 2.

Block 820 includes receiving a returning light pulse reflected from an object. The returning light pulse can be a reflection of the outbound light pulse from the object. The returning light pulse can be received by a light sensor of a LIDAR system, e.g., light detector 170 of FIG. 1B or light sensor 204 of FIG. 2.

Block 830 includes outputting a pulse signal representing the returning light pulse. For example, a light sensor of a LIDAR system (e.g., light detector 170 of FIG. 1B or light sensor 204 of FIG. 2) can be used to convert the light energy of the returning light pulse into an electrical signal.

Block 840 includes measuring timing information of the pulse signal using an FPGA. In some embodiments, the FPGA is calibrated and installed as described above with reference to blocks 600 and 700 of FIG. 5. For example, the FPGA can be calibrated according to one or more of the methods 600a-600c of FIGS. 6, 7, and 10. The FPGA can include a TDC configured to measure the timing information based at least in part on one or more individual delay times of the sequentially coupled delay units, and the individual delay times can be determined during calibration (e.g., using the method 600b of FIG. 7 and/or the method 600c of FIG. 10). At least some of the delay units can have different individual delay times. Optionally, the TDC can measure the timing information using a technique to reduce or eliminate bubbles in a data sequence generated by the TDC. Exemplary methods for measuring the timing information are discussed below with reference to FIGS. 12 and 13.

Block 860 includes calculating the distance to the object based at least in part on the timing information. In some embodiments, the calculating is performed using a controller (e.g., controller 206 of system 200). The controller may be included as part of the FPGA, or may be a separate device from the FPGA. The distance calculation can include using the timing information for the pulse signal to determine the object distance, as previously discussed.

Some or all of the processes of the method 800 can be performed using components carried onboard a movable object, such as an unmanned vehicle (e.g., a UAV) or a robot. In some embodiments, the light emitter, light sensor, FPGA, and/or controller are carried by a movable object (e.g., UAV, autonomous vehicle, or robot), and the method 800 further comprises controlling operation of the movable object based at least in part on the calculated distance to the object. For example, the calculated distance can be used as a basis for controlling movement of the movable object.

Figure 12:
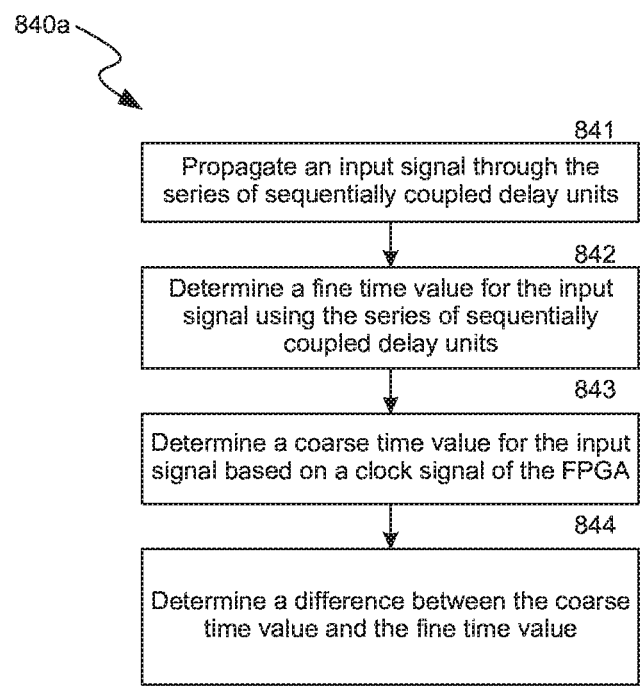
FIG. 12 is a flow diagram illustrating a method for measuring timing information based at least in part on individual delay times in accordance with representative embodiments of the present technology.

FIG. 12 is a flow diagram illustrating a method 840a for measuring timing information based at least in part on individual delay times in accordance with representative embodiments of the present technology. In some embodiments, some or all of the processes of the method 840a are performed using a TDC having a series of sequentially coupled delay units. Some or all of the processes of the method 840a can be subprocesses in the measurement process (block 840) of FIG. 11.

Block 841 includes propagating an input signal through the series of sequentially coupled delay units. The input signal can correspond to one or more portions of a pulse signal representing a returning light pulse. In some embodiments, the input signal is a square wave signal, in which the rising and/or falling edges of the square wave signal represent the time points at which the pulse signal reaches, exceeds, and/or falls below a particular voltage value.

Block 842 includes determining a fine time value for the input signal using the series of sequentially coupled delay units. In some embodiments, block 842 includes identifying a subset of the series of sequentially coupled delay units that receives the input signal prior to a next clock cycle of the FPGA. The subset can be identified based at least in part on a data sequence representing latched outputs of the delay units. For example, if the input signal is a rising edge signal, the data sequence can include a first segment of digital "1" values, corresponding to the subset of delay units that received the signal prior to the next clock cycle, followed by a second segment of digital "0" values, corresponding to the subset of delay units that did not receive the signal. As another example, if the input signal is a falling edge signal, the data sequence can include a first segment of digital "0" values, corresponding to the subset of delay units that received the signal prior to the next clock cycle, followed by a second segment of digital "1" values, corresponding to the subset of delay units that did not receive the signal.

In some embodiments, the fine time value corresponds to the sum of the individual delay times of the subset. For example, the fine time value for a signal received by a subset of delay units 1 through n can be calculated according to the relation $$T_f = \sum_{j=1}^{n} C_j / \sum_{i=1}^{maxbin} C_i \times T_{ck}$$

where $T_f$ is the fine time value, $T_{ck}$ is the FPGA clock period, $C_i$ is the count for the ith delay unit, and $C_j$ is the count for the jth delay unit.

Block 843 includes determining a coarse time value for the input signal based on a clock signal of the FPGA. In some embodiments, the coarse time value is calculated according to the relation $$T_c = C_c \times T_{ck}$$

where $T_c$ is the coarse time value, $T_{ck}$ is the FPGA clock period, and $C_c$ is the coarse count of the number of clock cycles that elapsed during the measurement.

Block 844 includes determining a difference between the coarse time value and the fine time value. In some embodiments, the timing information is determined according to the relation $$T = T_c - T_f$$

where T is the timing information, $T_c$ is the coarse time value, and $T_f$ is the fine time value. The time resolution of the fine time value (e.g., picosecond-level resolution) can be higher than the time resolution of the coarse time value (e.g., nanosecond-level), such that the resulting timing information has a higher time resolution (e.g., picosecond-level resolution) than would otherwise be possible using the coarse time value alone.

Figure 13:
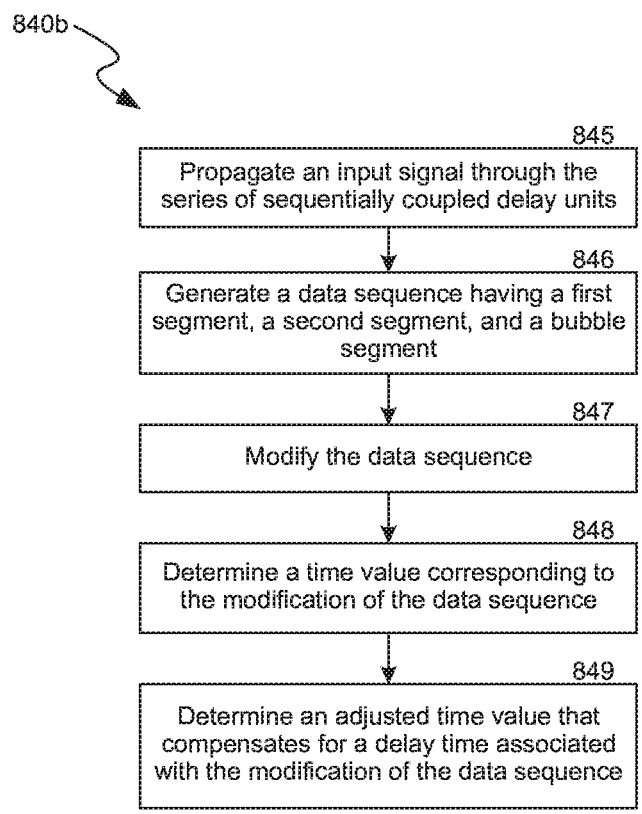
FIG. 13 is a flow diagram illustrating a method for measuring timing information using a technique to reduce bubbles in accordance with representative embodiments of the present technology.

FIG. 13 is a flow diagram illustrating a method 840b for measuring timing information using a technique to reduce bubbles in accordance with representative embodiments of the present technology. In some embodiments, some or all of the processes of the method 840b are performed using a TDC having a series of sequentially coupled delay units. Some or all of the processes of the method 840b can be subprocesses in the measurement process (block 840) of FIG. 11.

Block 845 includes propagating an input signal through the series of sequentially coupled delay units. The propagating of the input signal can be performed as described above with reference to block 841 of FIG. 12.

Block 846 includes generating a data sequence having a first segment, a second segment, and a bubble segment. The data sequence can correspond to propagation of the input signal through the series of sequentially coupled delay units. The generating of the data sequence can be performed as described above with reference to block 652 of FIG. 10.

Block 847 includes modifying the data sequence. Modifying the data sequence can be performed as described above with reference to block 654 of FIG. 10. In some embodiments, the modification need not actually be performed in the method 840b, such that block 847 is optional.

Block 848 includes determining a time value corresponding to the modification of the data sequence. In some embodiments, determining the time value includes identifying a delay unit corresponding to the modification of the data sequence, as described above with reference to block 656 of FIG. 10. The time value can be a fine time value corresponding to the sum of the individual delay times of a subset of units including the identified delay unit and at least one delay unit preceding the identified delay unit in the series. In some embodiments, the subset includes the identified delay unit and all the delay units preceding the identified delay unit in the series. The fine time value for the subset can be calculated as described above with reference to block 842 of FIG. 12.

Block 849 includes determining an adjusted time value that compensates for a delay time associated with the modification of the data sequence. In some embodiments, the time value corresponding to the modification of the data sequence includes a delay time relative to the actual time value for the input signal. The delay time can be a constant value and can be determined during calibration of the FPGA (e.g., block 600 of the method 500). For example, the delay time can be determined by measuring an input signal with a known time value, and calculating a difference between the known time value and the time value determined according to block 848. As another example, the delay time can be determined by measuring an object at a known distance from the optical measurement device, and calculating a difference between the actual time value for the return pulse signal from the object, which can be determined based on the known distance, and the time value determined according to the block 848. In some embodiments, the adjusted time value is configured to compensate for other types of delays, such as a delay time associated with a signal chain through which the input signal is transmitted during some or all of the processes described herein.

Although methods 840a and 840b are illustrated separately in FIGS. 12 and 13, these methods can be also be performed in combination with each other, such that measuring the timing information (block 840 of FIG. 11) involves performing these two methods sequentially or simultaneously. For example, in some embodiments, determining the fine time value for the input signal (block 842 of FIG. 12) includes generating a data sequence (block 846 of FIG. 13), modifying the data sequence (block 847 of FIG. 13), determining a time value corresponding to the modification (block 848 of FIG. 13), and/or determining an adjusted time value (block 849 of FIG. 13).

3. Further Representative Embodiments

Further representative embodiments of the present technology include a device for measuring distance to an object. The device comprises a light emitter configured to emit an outbound light pulse and a light sensor configured to receive a returning light pulse reflected from the object and output a pulse signal representing the returning light pulse. The device further comprises a field-programmable gate array (FPGA) coupled to the light sensor and including a time-to-digital converter (TDC) having a series of sequentially coupled delay units. Individual sequentially coupled delay units are associated with corresponding individual delay times. At least some of the sequentially coupled delay units have different individual delay times. The TDC is configured to measure timing information of the pulse signal based at least in part on the individual delay times of the sequentially coupled delay units. The device further includes a controller configured to calculate the distance to the object based on the timing information.

In some embodiments, the light emitter, light sensor, FPGA, and controller are carried by an unmanned aerial vehicle, an autonomous vehicle, or a robot.

In some embodiments, the TDC is configured to measure the timing information by propagating an input signal through the series of sequentially coupled delay units. The input signal can correspond to one or more portions of the pulse signal. The TDC can be further configured to determine a fine time value for the input signal using the series of sequentially coupled delay unit and determine a coarse time value for the input signal based on a number of elapsed clock cycles of the FPGA. In some embodiments, the fine time value corresponds to a sum of the individual delay times of a subset of the series of sequentially coupled delay units that receives the input signal prior to a next clock cycle of the FPGA. The timing information can correspond to a difference between the coarse time value and the fine time value. The time resolution of the fine time value can be higher than a time resolution of the coarse time value.

In some embodiments, the TDC includes a latch unit having a plurality of latches, individual latches being coupled to corresponding sequential delay units.

Further representative embodiments of the present technology include a method for measuring distance to an object. The method comprises emitting, by a light emitter, an outbound light pulse and receiving, at a light sensor, a returning light pulse reflected from the object. The method comprises outputting, by the light sensor, a pulse signal representing the returning light pulse. The method comprises measuring, using a field-programmable gate array (FPGA), timing information of the pulse signal. The FPGA includes a time-to-digital converter (TDC) having a series of sequentially coupled delay units. Individual sequentially coupled delay units are associated with corresponding individual delay times. At least some of the sequentially coupled delay units have different individual delay times. The TDC is configured to measure the timing information of the pulse signal based at least in part on the individual delay times of the sequentially coupled delay units. The method further comprises calculating, using a controller, the distance to the object based on the timing information.

In some embodiments, measuring the timing information comprises propagating an input signal through the series of sequentially coupled delay units, the input signal corresponding to one or more portions of the pulse signal. Measuring the timing information can further comprise determining a fine time value for the input signal using the series of sequentially coupled delay units. Measuring the timing information can further comprise determining a coarse time value for the input signal based on a number of elapsed clock cycles of the FPGA.

In some embodiments, determining the fine time value comprises latching outputs of the series of sequentially coupled delay units using a plurality of latches as the input signal propagates through the series of sequentially coupled delay units. Determining the fine time value can comprise using the latched outputs to identify the subset of the series of sequentially coupled delay units. Determining the fine time value can comprise using the latched outputs to identify a delay unit that is last in the series of sequentially coupled delay units to receive the input signal prior to the next clock cycle of the FPGA.

Further representative embodiments of the present technology include a method for manufacturing an optical distance measurement device. The method comprises installing, in the optical distance measurement device, a field-programmable gate array (FPGA) including a time-to-digital converter (TDC), the TDC including a series of sequentially coupled delay units. The FPGA has been calibrated in accordance with the following method: receiving, at the series of sequentially coupled delay units, a plurality of calibration signals; and determining an individual delay time for corresponding sequentially coupled delay units. An individual delay time corresponds to a count representing a number of times the corresponding delay unit is last in the series of sequentially coupled delay units to receive a calibration signal prior to a next clock cycle of the FPGA.

In some embodiments, the method further comprises calibrating the FPGA by: receiving, at the series of sequentially coupled delay units, the plurality of calibration signals; and determining the individual delay time for corresponding sequentially coupled delay units. The plurality of calibration signals can include a plurality of randomized signals. The plurality of randomized signals can be randomized with respect to a clock signal of the FPGA.

In some embodiments, at least some of the sequentially coupled delay units have different individual delay times. The individual delay time for a corresponding delay unit cam be proportional to the count for the delay unit. In some embodiments, the method further comprises calculating the individual delay time based at least in part on a ratio representing the count of the corresponding delay unit divided by a sum of the counts of each of the sequentially coupled delay units.

In some embodiments, the method further comprises propagating the plurality of calibration signals through the series of sequentially coupled delay units. The method can further comprise latching outputs of the series of sequentially coupled delay units using a plurality of latches as a calibration signal propagates through the series of sequentially coupled delay units. The method can further comprise using the latched outputs to identify a delay unit that is last in the series of sequentially coupled delay units to receive the calibration signal prior to the next clock cycle of the FPGA.

Further representative embodiments of the present technology include a device for measuring distance to an object. The device comprises a light emitter configured to emit an outbound light pulse and a light sensor configured to receive a returning light pulse reflected from the object and output a pulse signal representing the returning light pulse. The device further comprises a field-programmable gate array (FPGA) coupled to the light sensor and including a time-to-digital converter (TDC) having a series of sequentially coupled delay units. The TDC is configured to measure timing information of the pulse signal by propagating an input signal through the series of sequentially coupled delay units, the input signal corresponding to one or more portions of the pulse signal. The TDC is further configured to generate a data sequence having a first segment of only digital "1" data values, a second segment of only digital "0" data values, and a bubble segment between the first and second segments. The bubble segment includes at least one digital "1" data value between neighboring digital "0" values and/or at least one digital "0" value between neighboring digital "1" data values. The TDC is further configured to determine a time value corresponding to a modification of the data sequence in which the at least one digital "1" data value of the bubble segment is moved toward the first segment and the at least one digital "0" data value of the bubble segment is moved toward the second segment. The device further comprises a controller configured to calculate the distance to the object based at least in part on the timing information.

In some embodiments, the TDC includes a latch unit coupled to the series of sequentially coupled delay units. The latch unit can include a plurality of latches, and individual latches can be coupled to a corresponding delay unit of the sequentially coupled delay units and configured to latch an output of the corresponding delay unit. The data sequence can include the outputs latched by the plurality of latches.

In some embodiments, individual latches are associated with a corresponding latching time for latching the output of the corresponding delay unit. At least one of the latches can have a latching time greater than the individual delay time of the corresponding delay unit. At least one digital data value of the bubble segment can correspond to the output latched by the at least one latch.

In some embodiments, the TDC is configured to determine the time value by identifying a delay unit corresponding to the modification of the data sequence. The first segment can be positioned before the second segment, and the identified delay unit can correspond to a digital "1" data value of the first segment adjacent to the second segment in the modification of the data sequence. The second segment can be positioned before the first segment, and the identified delay unit can correspond to a digital "0" data value of the second segment adjacent to the first segment in the modification of the signal.

In some embodiments, the TDC is further configured to determine an adjusted time value that compensates for a delay time associated with the modification of the data sequence.

Further representative embodiments of the present technology include a method for measuring distance to an object. The method comprises emitting, by a light emitter, an outbound light pulse, and receiving, at a light sensor, a returning light pulse reflected from the object. The method further comprises outputting, by the light sensor, a pulse signal representing the returning light pulse. The method further comprises measuring, using a field-programmable gate array (FPGA), timing information of the pulse signal. The FPGA includes a time-to-digital converter (TDC) having a series of sequentially coupled delay unit. The TDC is configured to measure the timing information of the pulse signal by propagating an input signal through the series of sequentially coupled delay units, the input signal corresponding to one or more portions of the pulse signal. The TDC is configured to generate a data sequence having a first segment of only digital "1" data values, a second segment of only digital "0" data values, and a bubble segment between the first and second segments. The bubble segment includes at least one digital "1" data value between neighboring digital "0" values and/or at least one digital "0" value between neighboring digital "1" data values. The TDC is configured to determine a time value corresponding to a modification of the data sequence in which the at least one digital "1" data value of the bubble segment is moved toward the first segment and the at least one digital "0" data value of the bubble segment is moved toward the second segment. The method further comprises calculating, using a controller, the distance to the object based at least in part on the timing information.

In some embodiments, generating the data sequence comprises latching outputs of the series of sequentially coupled delay units using a plurality of latches as the input signal propagates through the series of sequentially coupled delay units. Generating the data sequence can comprise latching an output of a delay unit using a latch having a latching time greater than the individual delay time of the delay unit, the latched output corresponding to at least one digital data value of the bubble segment. Generating the data sequence can comprise latching an output of a delay unit using a latch having a latching time shorter than the individual delay time of the delay unit, the latched output corresponding to at least one digital data value of the first or second segment.

Further representative embodiments of the present technology include a method for manufacturing an optical distance measurement device. The method comprises installing, in the optical distance measurement device, a field-programmable gate array (FPGA) including a time-to-digital converter (TDC), the TDC including a series of sequentially coupled delay units. The FPGA has been calibrated in accordance with the following method: receiving, at the series of sequentially coupled delay units, a plurality of calibration signals; and determining an individual delay time for corresponding individual sequentially coupled delay units. The determining includes generating a data sequence having a first segment of only digital "1" data values, a second segment of only digital "0" data values, and a bubble segment between the first and second segments. The bubble segment includes at least one digital "1" data value between neighboring digital "0" values and/or at least one digital "0" value between neighboring digital "1" data values. The determining includes identifying a delay unit corresponding to a modification of the data sequence in which the at least one digital "1" data value of the bubble segment is moved toward the first segment and the at least one digital "0" data value of the bubble segment is moved toward the second segment.

In some embodiments, the method further comprises calibrating the FPGA by: receiving, at the series of sequentially coupled delay units, the plurality of calibration signals; and determining the individual delay time for corresponding individual sequentially coupled delay units. The determining can include generating the data sequence having the first segment, the second segment, and the bubble segment, and identifying the delay unit corresponding to the modification of the data sequence.

In some embodiments, the plurality of calibration signals includes a plurality of randomized signals, the plurality of randomized signals being randomized with respect to a clock signal of the FPGA. Determining the individual delay time can comprise calculating a count representing a number of times the corresponding delay unit is identified as being last in the series of sequentially coupled delay units to receive a randomized signal prior to a next clock cycle of the FPGA.

In some embodiments, generating the data sequence comprises latching outputs of the series of sequentially coupled delay units using a plurality of latches as the input signal propagates through the series of sequentially coupled delay units. Generating the data sequence can comprise latching an output of a delay unit using a latch having a latching time greater than the individual delay time of the delay unit, the latched output corresponding to at least one digital data value of the bubble segment. Generating the data sequence can comprise latching an output of a delay unit using a latch having a latching time shorter than the individual delay time of the delay unit, the latched output corresponding to at least one digital data value of the first or second segment.

While the present disclosure contains many specifics, these should not be construed as limitations on the scope of the technology or of what may be claimed, but rather as descriptions of features that may be specific to particular embodiments of particular inventions. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Further, while advantages associated with certain embodiments of the technology have been described in the context of those embodiments, other embodiments may also exhibit such advantages, and not all embodiments need necessarily exhibit such advantages to fall with within the scope of the present technology. Accordingly, the present disclosure and associated technology can encompass other embodiments not expressly shown or described herein.

Only a number of implementations and examples are described and other implementations, enhancements and variations can be made based on what is described and illustrated in the present disclosure.

To the extent any materials incorporated herein conflict with the present disclosure, the present disclosure controls.

At least a portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

We claim:

1. A device for measuring a distance to an object, the device comprising:
   a light emitter configured to emit an outbound light pulse;
   a light sensor configured to receive a returning light pulse reflected from the object and output a pulse signal representing the returning light pulse;
   a field-programmable gate array (FPGA) coupled to the light sensor and including a time-to-digital converter (TDC) having a series of sequentially coupled delay units, individual sequentially coupled delay units associated with corresponding individual delay units, wherein at least some of the sequentially coupled delay units have different individual delay times, and wherein the TDC is configured to measure timing information of the pulse signal by:
   propagating an input signal through the series of sequentially coupled delay units, the input signal corresponding to one or more portions of the pulse signal,
   generating a data sequence having a first segment of only digital "1" data values, a second segment of only digital "0" data values, and a bubble segment between the first and second segments, the bubble segment including at least one digital "1" data value between neighboring digital "0" values and/or at least one digital "0" value between neighboring digital "1" data values, and
   determining a time value corresponding to a modification of the data sequence in which the at least one digital "1" data value of the bubble segment is moved toward the first segment and the at least one digital "0" data value of the bubble segment is moved toward the second segment; and
   a controller configured to calculate the distance to the object based on the timing information.

2. The device of claim 1 wherein the light emitter, light sensor, FPGA, and controller are carried by an unmanned aerial vehicle, an autonomous vehicle, or a robot.

3. The device of claim 1 wherein the TDC includes a latch unit coupled to the series of sequentially coupled delay units.

4. The device of claim 3 wherein the latch unit includes a plurality of latches, and wherein individual latches are coupled to a corresponding delay unit of the sequentially coupled delay units and configured to latch an output of the corresponding delay unit.

5. The device of claim 4 wherein the data sequence includes the outputs latched by the plurality of latches.

6. The device of claim 4 wherein individual latches are associated with a corresponding latching time for latching the output of the corresponding delay unit.

7. The device of claim 6 wherein at least one of the latches has a latching time greater than the individual delay time of the corresponding delay unit.

8. The device of claim 7 wherein at least one digital data value of the bubble segment corresponds to the output latched by the at least one latch.

9. The device of claim 1 wherein the TDC is further configured to determine an adjusted time value that compensates for a delay time associated with the modification of the data sequence.

10. The device of claim 1 wherein:
    the TDC includes a latch unit coupled to the series of sequentially coupled delay units, the latch unit including a plurality of latches, wherein individual latches are coupled to a corresponding delay unit of the sequentially coupled delay units and configured to latch an output of the corresponding delay unit, and wherein the data sequence includes the outputs latched by the plurality of latches; and
    the TDC is configured to:
    determine the time value by identifying a delay unit corresponding to the modification of the data sequence, and
    determine an adjusted time value that compensates for a delay time associated with the modification of the data sequence.

11. The device of claim 1 wherein the TDC is configured to determine the time value by identifying a delay unit corresponding to the modification of the data sequence.

12. The device of claim 8 wherein the first segment is positioned before the second segment, and wherein the identified delay unit corresponds to a digital "1" data value of the first segment adjacent to the second segment in the modification of the data sequence.

13. The device of claim 8 wherein the second segment is positioned before the first segment, and wherein the identified delay unit corresponds to a digital "0" data value of the second segment adjacent to the first segment in the modification of the signal.

14. A method for measuring distance to an object, the method comprising:
    emitting, by a light emitter, an outbound light pulse;
    receiving, at a light sensor, a returning light pulse reflected from the object;
    outputting, by the light sensor, a pulse signal representing the returning light pulse;
    measuring, using a field-programmable gate array (FPGA), timing information of the pulse signal, wherein the FPGA includes a time-to-digital converter (TDC) having a series of sequentially coupled delay units, and wherein the TDC is configured to measure the timing information of the pulse signal by:

propagating an input signal through the series of sequentially coupled delay units, the input signal corresponding to one or more portions of the pulse signal, generating a data sequence having a first segment of only digital "1" data values, a second segment of only digital "0" data values, and a bubble segment between the first and second segments, the bubble segment including at least one digital "1" data value between neighboring digital "0" values and/or at least one digital "0" value between neighboring digital "1" data values, and determining a time value corresponding to a modification of the data sequence in which the at least one digital "1" data value of the bubble segment is moved toward the first segment and the at least one digital "0" data value of the bubble segment is moved toward the second segment; and calculating, using a controller, the distance to the object based at least in part on the timing information.

15. The method of claim 14 wherein the light emitter, light sensor, FPGA, and controller are carried by an unmanned vehicle, autonomous vehicle, or robot, and wherein the method further comprises controlling operation of the unmanned aerial vehicle, autonomous vehicle, or robot based at least in part on the calculated distance to the object.

16. The method of claim 14 wherein generating the data sequence comprises latching outputs of the series of sequentially coupled delay units using a plurality of latches as the input signal propagates through the series of sequentially coupled delay units.

17. The method of claim 16 wherein generating the data sequence comprises latching an output of a delay unit using a latch having a latching time greater than the individual delay time of the delay unit, the latched output corresponding to at least one digital data value of the bubble segment.

18. The method of claim 16 wherein generating the data sequence comprises latching an output of a delay unit using a latch having a latching time shorter than the individual delay time of the delay unit, the latched output corresponding to at least one digital data value of the first or second segment.

19. The method of claim 14 wherein determining the time value comprises identifying a delay unit corresponding to the modification of the data sequence.

* * * * *